(12) United States Patent
Zhou et al.

(10) Patent No.: US 12,342,693 B2
(45) Date of Patent: Jun. 24, 2025

(54) DISPLAY SUBSTRATE AND DISPLAY DEVICE HAVING CONDUCTIVE ELEMENT WITH RECESSED PORTION HAVING UNEVEN SURFACE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rui Zhou, Beijing (CN); Bo Shi, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,926

(22) PCT Filed: May 14, 2021

(86) PCT No.: PCT/CN2021/093915
§ 371 (c)(1),
(2) Date: Jun. 2, 2022

(87) PCT Pub. No.: WO2022/236826
PCT Pub. Date: Nov. 17, 2022

(65) Prior Publication Data
US 2024/0164157 A1    May 16, 2024

(51) Int. Cl.
*H10K 59/131* (2023.01)
*H10K 59/65* (2023.01)
*H10K 59/80* (2023.01)

(52) U.S. Cl.
CPC ......... *H10K 59/131* (2023.02); *H10K 59/805* (2023.02); *H10K 59/873* (2023.02);
(Continued)

(58) Field of Classification Search
CPC .... H10K 59/65; H10K 59/878; H10K 59/131; H10K 59/805; H10K 59/873
See application file for complete search history.

(56) References Cited

U.S. PATENT DOCUMENTS

| 8,103,976 B2 | 1/2012 | Kim et al. |
| 10,216,028 B2 | 2/2019 | Choi |

(Continued)

FOREIGN PATENT DOCUMENTS

| CN | 1519890 A | 8/2004 |
| CN | 105118834 A | 12/2015 |

*Primary Examiner* — Nduka E Ojeh
(74) *Attorney, Agent, or Firm* — LEASON ELLIS LLP

(57) ABSTRACT

A display substrate and a display device are provided. The display substrate includes: a base substrate; a first conductive element, located on the base substrate; a first planarization layer, located on the first conductive element; a second conductive element, located on the first planarization layer, and connected to the first conductive element through a first via hole penetrating the first planarization layer; a second planarization layer, located on the second conductive element; the second conductive element is recessed at the first via hole, so that the second conductive element has a recessed portion and a peripheral portion located outside the recessed portion, the recessed portion has a bottom portion and a side portion, the bottom portion and the peripheral portion are connected by the side portion, and the side portion of the recessed portion has an uneven surface to be configured to make light irradiated thereon be diffusely reflected.

20 Claims, 11 Drawing Sheets

(52) U.S. Cl.
CPC ....... *H10K 59/65* (2023.02); *H10K 59/80518* (2023.02); *H10K 59/878* (2023.02)

(56) References Cited

U.S. PATENT DOCUMENTS

| | | | |
|---|---|---|---|
| 11,527,590 B2* | 12/2022 | Sim | H10K 59/878 |
| 2012/0235175 A1* | 9/2012 | Prushinskiy | H10K 59/10 438/34 |
| 2015/0060826 A1* | 3/2015 | Matsumoto | H10K 59/122 438/34 |
| 2017/0250233 A1 | 8/2017 | Ushikubo | |
| 2020/0075699 A1* | 3/2020 | Kim | H10K 59/80515 |
| 2022/0206636 A1* | 6/2022 | Lu | G06F 3/0412 |

* cited by examiner

The side portion of the recessed portion facing away from the base substrate are uneven surfaces.

DISPLAY SUBSTRATE AND DISPLAY DEVICE HAVING CONDUCTIVE ELEMENT WITH RECESSED PORTION HAVING UNEVEN SURFACE

CROSS-REFERENCE TO RELATED PATENT APPLICATIONS

This application is a U.S. National Phase Entry of International Application No. PCT/CN2021/093915 filed on May 14, 2021. The present application claims priority to and the benefit of the above-identified applications and the above-identified applications are incorporated by reference herein in their entirety.

TECHNICAL FIELD

At least one embodiment of the present disclosure relates to a display substrate and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure relates to a display substrate and a display device.

At least one embodiment of the present disclosure provides a display substrate, comprising: a base substrate; a first conductive element, located on the base substrate; a first planarization layer, located on the first conductive element; a second conductive element, located on the first planarization layer, and connected to the first conductive element through a first via hole penetrating the first planarization layer; a second planarization layer, located on the second conductive element; and a conductive line, located on the second planarization layer, wherein the second conductive element is recessed at the first via hole, so that the second conductive element has a recessed portion and a peripheral portion located outside the recessed portion, the recessed portion has a bottom portion and a side portion, the bottom portion and the peripheral portion are connected by the side portion, and the side portion of the recessed portion has an uneven surface to be configured to make light irradiated thereon be diffusely reflected.

For example, the first planarization layer has an uneven surface at a position corresponding to the side portion, on which the second conductive element is conformably disposed.

For example, the side portion and the base substrate have an included angle, and the included angle is an acute angle.

For example, at least one of the bottom portion and the peripheral portion of the second conductive element has an uneven surface.

For example, both a surface of the side portion of the recessed portion close to the base substrate and a surface of the side portion of the recessed portion facing away from the base substrate are uneven surfaces.

For example, a surface of the second conductive element close to the base substrate is a smooth surface, and a surface of the side portion facing away from the base substrate is an uneven surface.

For example, a surface of at least one of the bottom portion and the peripheral portion facing away from the base substrate is an uneven surface.

For example, the display substrate further comprises a pixel unit, wherein the pixel unit comprises a pixel circuit and a light-emitting element, the pixel circuit is configured to drive the light-emitting element, the pixel unit comprises a first pixel unit and a second pixel unit, the display substrate comprises a first display region and a second display region, the pixel circuit and the light-emitting element of the first pixel unit are located in the first display region, the pixel circuit of the second pixel unit is located in the first display region, the light-emitting element of the second pixel unit is located in the second display region, and the pixel circuit of the second pixel unit is connected to the light-emitting element of the second pixel unit through the conductive line.

For example, the second display region is a light-transmitting display region, an orthographic projection of the pixel circuit of the first pixel unit on the base substrate at least partially overlaps with an orthographic projection of the light-emitting element of the first pixel unit on the base substrate, and an orthographic projection of the pixel circuit of the second pixel unit on the base substrate does not overlap with an orthographic projection of the light-emitting element of the second pixel unit on the base substrate.

For example, an orthographic projection of the conductive line on the base substrate partially overlaps with the orthographic portion of the pixel circuit of the first pixel unit on the substrate.

For example, the display substrate further comprises a connection element, wherein the pixel circuit of the pixel unit is connected to the conductive line through the connection element or is connected to the light-emitting element of the first pixel unit.

For example, the connection element comprises a first connection electrode and a second connection electrode, and the first connection electrode is connected to the second connection electrode.

For example, the first conductive element comprises the first connection electrode, and the second conductive element comprises the second connection electrode connected to the first connection electrode.

For example, the first conductive element and the first connection electrode are located in the same layer, and the second conductive element and the second connection electrode are located in the same layer.

For example, the pixel circuit comprises a driving transistor, and the driving transistor comprises a gate electrode; and the display substrate further comprises: a first gate signal line, connected to the gate electrode of the driving transistor; a constant voltage line, configured to provide a first constant voltage to the pixel circuit; and a shield electrode, connected to the constant voltage line, and an orthographic projection of the first gate signal line on the base substrate falls within an orthographic projection of the shield electrode on the base substrate.

For example, the first conductive element comprises the constant voltage line, and the second conductive element comprises the shield electrode connected to the constant voltage line.

For example, the first conductive element and the constant voltage line are located in the same layer, and the second conductive element and the shield electrode are located in the same layer.

For example, a plurality of the conductive lines are provided, and an orthographic projection of at least one of the plurality of conductive lines on the base substrate overlaps with an orthographic projection of the first via hole on the base substrate.

For example, the material of the second conductive element comprises metal, and the material of the conductive line comprises transparent conductive material.

At least one embodiment of the present disclosure further provides a display substrate, comprising: a base substrate, comprising a first display region and a second display region; a pixel unit, located on the base substrate, wherein the pixel unit comprises a pixel circuit and a light-emitting element, the pixel circuit is configured to drive the light-emitting element, the pixel unit comprises a first pixel unit and a second pixel unit, the pixel circuit and the light-emitting element of the first pixel unit are located in the first display region, the pixel circuit of the second pixel unit is located in the first display region, the light-emitting element of the second pixel unit is located in the second display region, and the pixel circuit of the second pixel unit is connected to the light-emitting element of the second pixel unit through a conductive line; a connection element, connected to the pixel circuit, wherein the pixel circuit of the first pixel unit is connected to the light-emitting element of the first pixel unit through the connection element, or, the pixel circuit of the second pixel unit is connected to the conductive line through the connection element, and the connection element comprises a first connection electrode and a second connection electrode; a first planarization layer, located on the first connection electrode, wherein the second connection electrode is located on the first planarization layer, and is connected to the first connection electrode through a via hole penetrating the first planarization layer; and a second planarization layer, located on the second connection electrode, wherein the conductive line is located on the second planarization layer, the second connection electrode is recessed at the via hole, so that the second conductive electrode has a recessed portion and a peripheral portion located outside the recessed portion, the recessed portion has a bottom portion and a side portion, the bottom portion and the peripheral portion are connected by the side portion, and the side portion of the second connection electrode has an uneven surface to be configured to make light irradiated thereon be diffusely reflected.

For example, the pixel circuit comprises a driving transistor, and the driving transistor comprises a gate electrode; the display substrate further comprises: a first gate signal line, connected to the gate electrode of the driving transistor; a constant voltage line, configured to provide a first constant voltage to the pixel circuit; and a shield electrode, connected to the constant voltage line, and an orthographic projection of the first gate signal line on the base substrate falls within an orthographic projection of the shield electrode on the base substrate, wherein the first planarization layer is located on the constant voltage line, the shield electrode is located on the first planarization layer, the second planarization layer is located on the shield electrode, and the shield electrode is connected to the constant voltage line through a via hole penetrating the first planarization layer; the shield electrode is recessed at the via hole where the shield electrode is connected to the constant voltage line, so that the shield electrode has a recessed portion and a peripheral portion located outside the recessed portion, the recessed portion of the shield electrode has a bottom portion and a side portion, the bottom portion of the shield electrode is connected to the peripheral portion of the shield electrode through the side portion of the shield electrode, and the side portion of the shield electrode has an uneven surface to be configured to make light irradiated thereon be diffusely reflected.

At least one embodiment of the present disclosure further provides a display device, comprising the display substrate of any one embodiment of the present disclosure.

For example, the display device further comprises a photosensitive sensor, wherein the photosensitive sensor is located on one side of the display substrate.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objectives, technical details, and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With the continuous development of mobile phone screen, full-screen mobile phone and under-screen camera technology have become hotspots. In order to improve the PPI (Pixel Per Inch) and transmittance of a camera region, an under-screen camera region usually retains light-emitting elements, and a driving circuit of the light-emitting elements is placed in other positions, for example, the driving circuit can adopt an external or compression scheme, and usually a transparent conductive line is used to connect the light-emitting elements and the driving circuit to complete the driving and lighting of the light-emitting elements.

Figure 1:
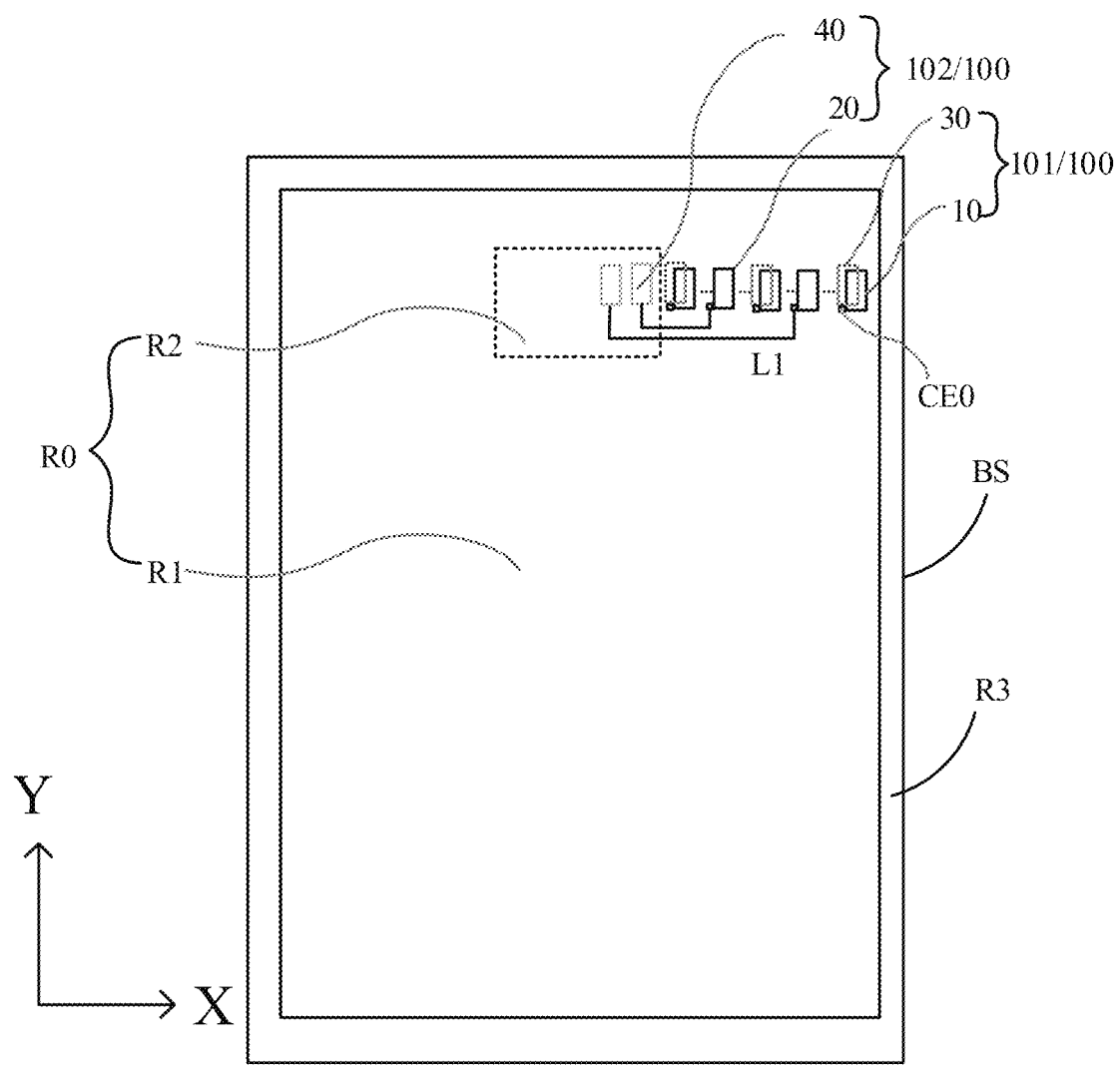
FIG. 1 is a schematic diagram of a display panel.

FIG. 1 is a schematic diagram of a display panel. As illustrated in FIG. 1, the display panel includes a display region R0 and a peripheral region R3. The peripheral region R3 is a non-display region. The display region R0 includes a first display region R1 and a second display region R2. For example, hardware such as a photosensitive sensor (e.g., a camera) is disposed at a position of one side of the display panel corresponding to the second display region R2. For example, the second display region R2 is a light-transmitting display region, and the first display region R1 is a display region. For example, the first display region R1 is opaque and only used for display. The first display region R1 and the second display region R2 together constitute a region of the display screen of the display panel.

As illustrated in FIG. 1, the display panel includes a base substrate BS and a pixel unit 100 located on the base substrate BS. The pixel unit 100 include a first pixel unit 101 and a second pixel unit 102, the first pixel unit 101 includes a first pixel circuit 10 and a first light-emitting element 30, and the second pixel unit 102 includes a second pixel circuit 20 and a second light-emitting element 40. The first pixel circuit 10 and the first light-emitting element 30 of the first pixel unit 101 are located in the first display region R1, the second pixel circuit 20 of the second pixel unit 102 is located in the first display region R1, and the second light-emitting element 40 of the second pixel unit 102 is located in the second display region R2. For example, the first pixel circuit 10 is referred to as an in-situ pixel circuit, and the second pixel circuit 20 is referred to as an ex-situ pixel circuit. Both the first pixel circuit 10 and the second pixel circuit 20 are driving circuits. As illustrated in FIG. 1, in the second display region R2, a light-transmitting sub-region is between adjacent second light-emitting elements 40, and the region where the second light-emitting element 40 is located is a display sub-region.

For example, as illustrated in FIG. 1, the display panel includes a plurality of first pixel circuits 10, a plurality of second pixel circuits 20 and a plurality of first light-emitting elements 30 located in the first display region R1, and a plurality of second light-emitting elements 40 located in the second display region R2. For example, the plurality of second pixel circuits 20 are distributed among the plurality of first pixel circuits 10 at intervals.

In order to improve the light transmittance of the second display region R2, only light-emitting elements are provided in the second display region R2, and the pixel circuits driving the light-emitting elements in the second display region R2 are provided in the first display region R1. That is, the light transmittance of the second display region R2 is improved by arranging the light-emitting elements and the pixel circuits separately. That is, no pixel circuit is provided in the second display region R2.

For example, as illustrated in FIG. 1, at least one first pixel circuit 10 of the plurality of first pixel circuits 10 is connected to at least one first light-emitting element 30 of the plurality of first light-emitting elements 30, and an orthographic projection of the at least one first pixel circuit 10 on the base substrate BS at least partially overlaps with an orthographic projection of the at least one first light-emitting element 30 on the base substrate BS. The at least one first pixel circuit 10 can be used to provide a driving signal for a first light-emitting element 30, which is connected to the at least one first pixel circuit 10, to drive the first light-emitting element 30 to emit light.

FIG. 1 takes the case where the second pixel circuit 20 that drives the second light-emitting elements 40 to emit light is located in the first display region R1 as an example. In this case, the display panel can adopt a driving circuit compression scheme. In the driving circuit compression scheme, the size of the driving circuit in the first direction X is reduced, so that the first pixel circuits 10 and the second pixel circuits 20 can be arranged in the first direction X, and the second pixel circuits 20 can be dispersedly arranged in the first pixel circuits 10. For example, the first direction X is the row direction, and in the same row of pixel circuits, the second pixel circuits 20 are arranged in the first pixel circuits 10 at intervals. Of course, in other embodiments, the second pixel circuits 20 may also be located in the peripheral region R3, thereby forming an external solution for the driving circuit.

For example, as illustrated in FIG. 1, the first display region R1 may be located on at least one side of the second display region R2. For example, in some embodiments, the first display region R1 surrounds the second display region R2. That is, the second display region R2 is surrounded by the first display region RE The second display region R2 can also be arranged at other positions, and the arrangement position of the second display region R2 is determined according to needs. For example, the second display region R2 may be located at the top middle position of the base substrate BS, or may be located at the upper left position or the upper right position of the base substrate BS.

For example, as illustrated in FIG. 1, at least one second pixel circuit 20 of the plurality of second pixel circuits 20 is connected to at least one second light-emitting element 40 of the plurality of second light-emitting elements 40 through a conductive line L1, and the at least one second pixel circuit 20 can be used to provide a driving signal for the second light-emitting element 40, which is connected to the at least one second pixel circuit 20, to drive the second light-emitting element 40 to emit light. As illustrated in FIG. 1, because the second light-emitting element 40 and the second pixel circuit 20 are located in different regions, there is no overlap between an orthographic projection of the at least one second pixel circuit 20 on the base substrate BS and an orthographic projection of the at least one second light-emitting element 40 on the base substrate BS.

For example, in the embodiments of the present disclosure, the first display region R1 is set as an opaque display region, and the second display region R2 is set as a light-transmitting display region. For example, the first display region R1 cannot transmit light, and the second display region R2 can transmit light. In this way, the display panel provided by the embodiment of the present disclosure does not need to perform drilling processing on the display panel, and the required hardware structure such as the photosensitive sensor is directly provided at a position of one side of the display panel corresponding to the second display region R2, which lays a solid foundation for the realization of a true full screen. In addition, because the second display region R2 only includes light-emitting elements and does not include pixel circuits, it is beneficial to increase the light transmittance of the second display region R2, so that the display panel has a better display effect.

For example, as illustrated in FIG. 1, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line. Of course, in other embodiments, the second light-emitting element 40 and the second pixel circuit 20 connected to the second light-emitting element 40 may not be located in the same row.

As illustrated in FIG. 1, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of conductive oxide material. For example, the conductive oxide material includes indium tin oxide (ITO), but is not limited thereto.

As illustrated in FIG. 1, one terminal of the conductive line L1 is connected to the second pixel circuit 20, and the other terminal of the conductive line L1 is connected to the second light-emitting element 40. As illustrated in FIG. 1, the conductive line L1 extends from the first display region R1 to the second display region R2.

Figure 2:
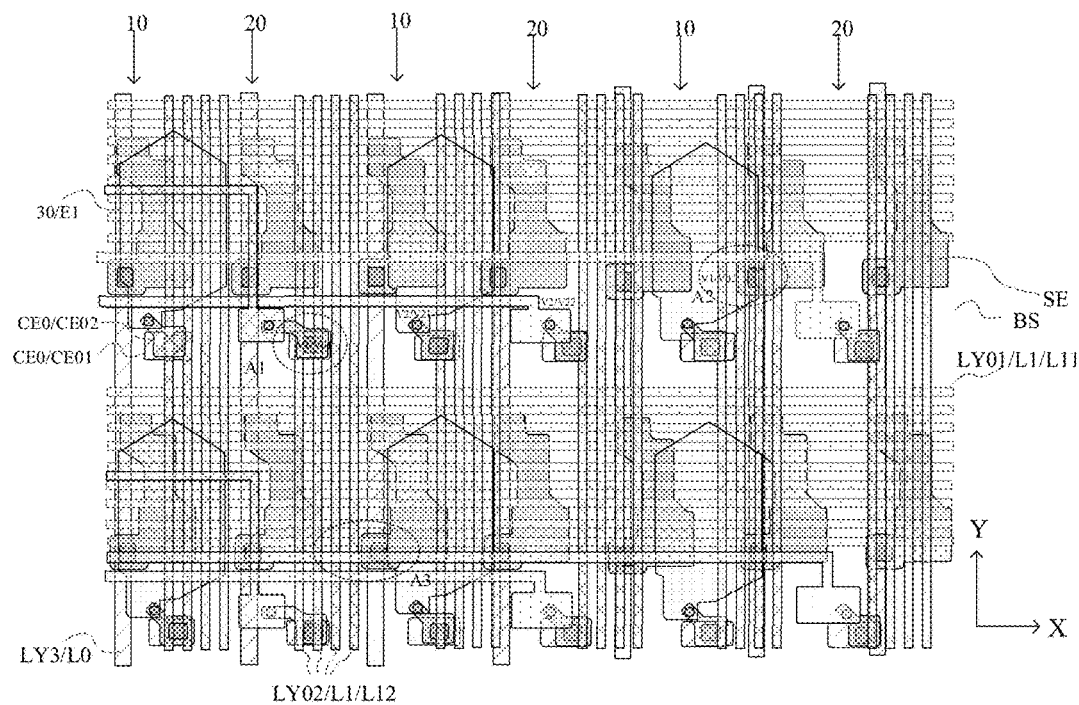
FIG. 2 is a schematic diagram of a partial structure of a display panel.
Figure 3:
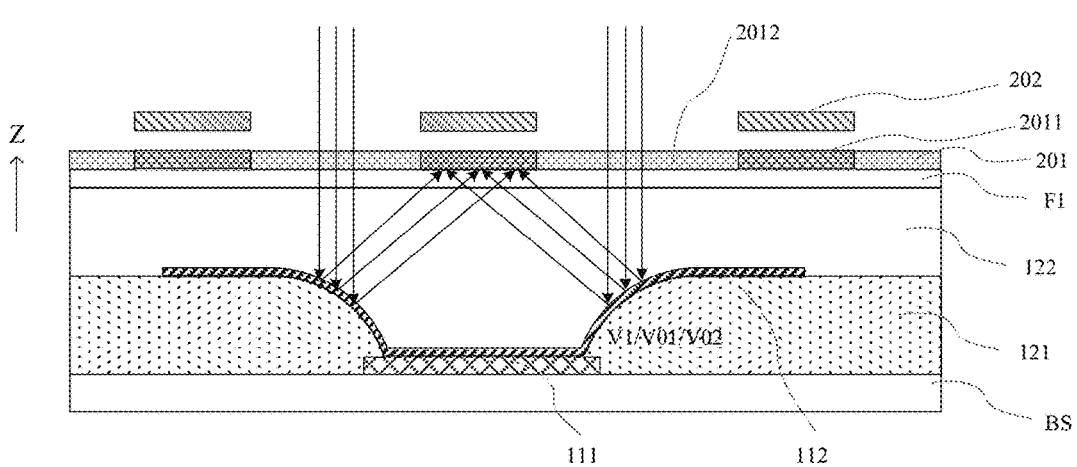
FIG. 3 is a schematic diagram of an exposure process as patterning a transparent conductive film in a process of forming the conductive line illustrated in FIG. 2 (cross-sectional view at A1, A2, or A3 in FIG. 2)
Figure 4:
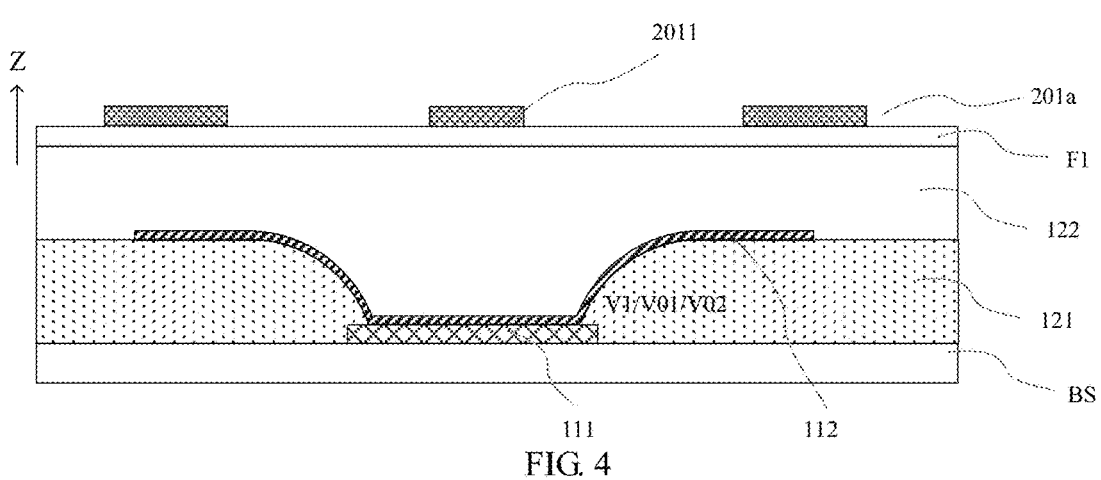
FIG. 4 is a schematic diagram of forming a photoresist pattern.
Figure 5:
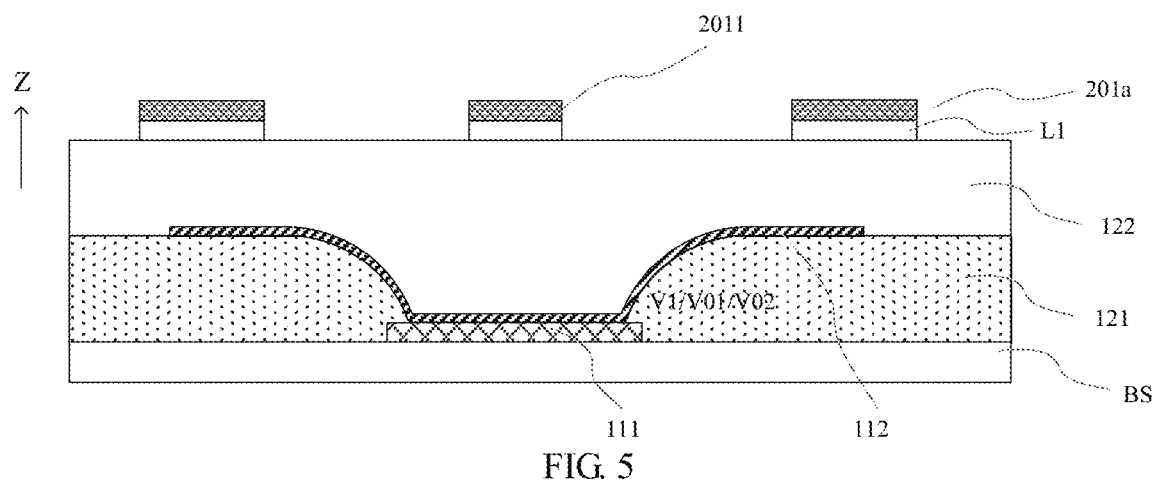
FIG. 5 is a schematic diagram of forming a conductive line.

FIG. 2 is a schematic diagram of a partial structure of a display panel. FIG. 3 is a schematic diagram of an exposure process as patterning a transparent conductive film in a process of forming the conductive line illustrated in FIG. 2 (cross-sectional view at A1, A2, or A3 in FIG. 2). FIG. 4 is a schematic diagram of forming a photoresist pattern. FIG. 5 is a schematic diagram of forming a conductive line. As illustrated in FIG. 2 and FIG. 3, the first conductive element 111 is located on the base substrate BS. The first planarization layer 121 is located on the first conductive element 111. The second conductive element 112 is located on the first planarization layer 121, and is connected to the first conductive element 111 through a first via hole V1 penetrating the first planarization layer 121. The second planarization layer 122 is located on the second conductive element 112. For example, the first via hole V1 illustrated in FIG. 3 includes the via hole V01 or via hole V02 illustrated in FIG. 2. As illustrated in FIG. 3, forming the conductive line L1 includes forming a transparent conductive film F1 on the second planarization layer 122, forming a photoresist film 201 on the transparent conductive film F1, and using a mask 202 as a mask to expose the photoresist film 201, so that the photoresist film 201 forms a photoresist retaining portion 2011 and a photoresist to-be-removed portion 2012. As illustrated in FIG. 4, a development process is performed after the exposure process. In the development process, the photoresist to-be-removed portion 2012 is removed to form a photoresist pattern 201a. As illustrated in FIG. 5, the transparent conductive film F1 is etched by using the photoresist pattern 201a as a mask to form the conductive line L1. The second conductive element 112 in FIG. 3 may be a connection element CE0 or a shield electrode SE illustrated in FIG. 2.

As illustrated in FIG. 2, the conductive lines L1 include a plurality of conductive lines L1, and the plurality of conductive lines L1 include a plurality of first conductive lines L11 located in a first transparent conductive layer LY01 and a plurality of second conductive lines L12 located in a second transparent conductive layer LY02. An insulating layer may be disposed between the first transparent conductive layer LY01 and the second transparent conductive layer LY02. In other embodiments, three or more transparent conductive layers may be included to provide more conductive lines. An insulating layer is provided between adjacent transparent conductive layers.

After the exposure process, the photoresist of the transparent conductive film is exposed to be broken and thinned, which leads to disconnection or thinning of the conductive line after developing and etching, resulting in poor display of dark spots. Optical microscope confirms that the position where the conductive line is broken and thinned is the position where the conductive line crosses the first via hole V1 of the first planarization layer 121, and further by performing a focused ion beam (FIB) analysis on the cross section of the first via hole V1 of the first planarization layer 121, it is found that a bowl-shaped portion of the second conductive element 112 is below the position where the conductive line, passing across the first via hole V1, is broken or thinned Therefore, as illustrated in FIG. 3, the reason for determining that the conductive line is broken or thinned is that: in the exposure process, the second conductive element 112 reflects light and condenses the light to the photoresist retaining portion 2011 of the photoresist above the bowl-shaped portion of the second conductive element 112 (corresponding to the position of the via hole V1), so that this part of the photoresist is exposed or partially exposed, and washed away after development, so that the conductive line formed after a process of etching the transparent conductive film using the photoresist pattern 201a as a mask is broken and thinned. As illustrated in FIG. 3 to FIG. 5, the photoresist retaining portion 2011 of the photoresist located in the middle position is irradiated by the partially reflected light, so that the conductive line below the photoresist is thinned.

FIG. 2 illustrates the first light-emitting element 30, represented by a first electrode E1 of the first light-emitting element 30. FIG. 2 illustrates first pixel circuit columns and second pixel circuit columns which are alternately arranged. In other embodiments, a plurality of first pixel circuit columns may be disposed between adjacent second pixel circuit columns.

FIG. 2 further illustrates a second via hole V2, which includes a via hole V21 or a via hole V22. Either the via hole V21 or the via hole V22 is a via hole penetrating at least one insulating layer. As illustrated in FIG. 2, the first electrode E1 of the first light-emitting element 30 is connected to the connection element CE0 through the via hole V21. As illustrated in FIG. 2, one terminal of the conductive line L1 is connected to the connection element CE0 through the via hole V22. The other terminal of the conductive line L1 is connected to the first electrode E1 of the second light-emitting element 40. That is, the connection element CE0 is connected to one terminal of the conductive line L1 through the second via hole V2, or the connection element CE0 is connected to the first electrode E1 of the first light-emitting element 30 through the second via hole V2. For example, the connection element CE0 connected to the first electrode E1 of the first light-emitting element 30 is referred to as a first connection element, and the connection element CE0 connected to the conductive line L1 is referred to as a second connection element.

The display panel provided by the embodiments illustrated in the various figures of the present disclosure is described by taking the case where one conductive line L1 is connected to one second pixel circuit and is connected to one second light-emitting element as an example. In other embodiments, one conductive line L1 may also be connected to a plurality of second light-emitting elements.

Figure 6:
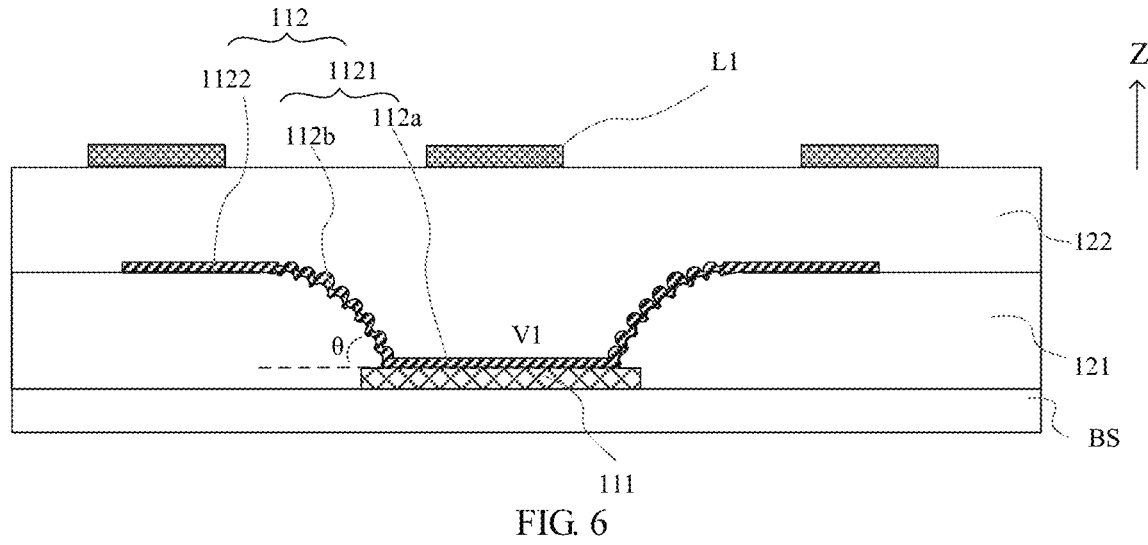
FIG. 6 is a schematic diagram of a display substrate according to an embodiment of the present disclosure.
Figure 7:
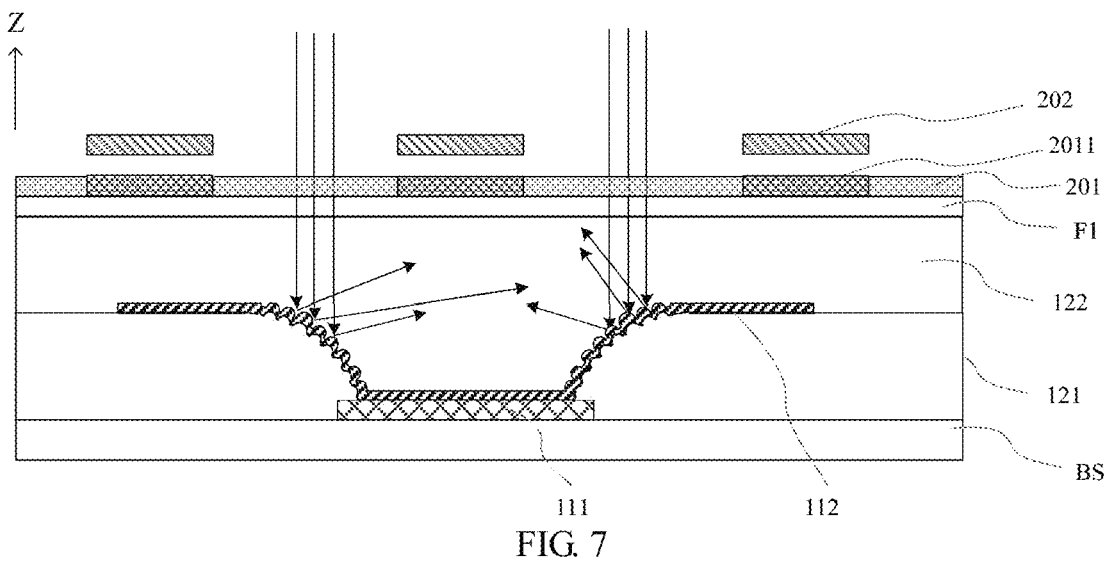
FIG. 7 is a schematic diagram of diffuse reflection of light irradiated on a side portion of a second conductive element in a display substrate according to an embodiment of the present disclosure.
Figure 8:
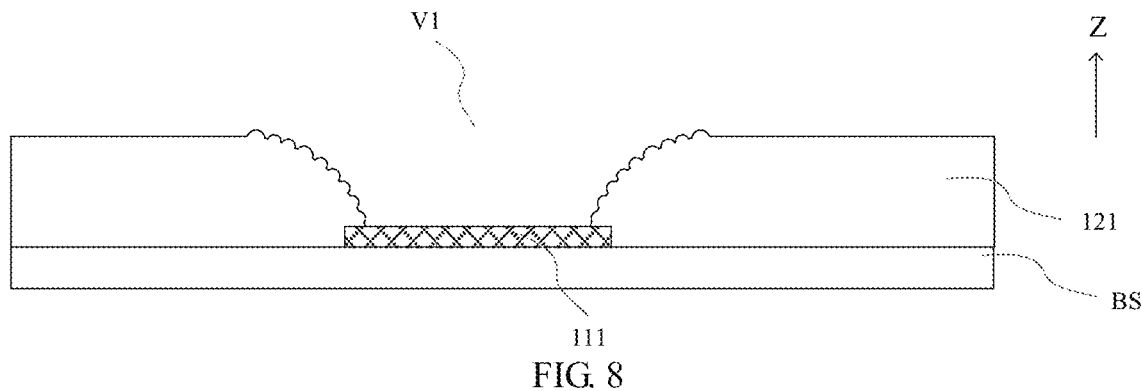
FIG. 8 is a schematic diagram of a first planarization layer and a first via hole in a display substrate according to an embodiment of the present disclosure.

FIG. 6 is a schematic diagram of a display substrate according to an embodiment of the present disclosure. FIG. 7 is a schematic diagram of diffuse reflection of light irradiated on a side portion of a second conductive element in a display substrate according to an embodiment of the present disclosure. FIG. 8 is a schematic diagram of a first planarization layer and a first via hole in a display substrate according to an embodiment of the present disclosure. As illustrated in FIG. 6, the display substrate includes a base substrate BS, a first conductive element 111, a first planarization layer 121, a second conductive element 112, a second planarization layer 122, and a conductive line L1. As illustrated in FIG. 6, the first conductive element 111 is located on the base substrate BS. The first planarization layer 121 is located on the first conductive element 111. The second conductive element 112 is located on the first planarization layer 121, and is connected to the first conductive element 111 through the first via hole V1 penetrating the planarization layer 121. The second planarization layer 122 is located on the second conductive element 112. The conductive line L1 is located on the second planarization layer 122.

For example, the materials of the first planarization layer 121 and the second planarization layer 122 include organic polymer materials, and the organic polymer materials include resins, but are not limited thereto. For example, the materials of the first planarization layer 121 and the second planarization layer 122 include polymethylmethacrylate (PMMA), polyimide (PI), but are not limited thereto.

As illustrated in FIG. 6, the second conductive element 112 is recessed at the first via hole V1, so that the second conductive element 112 has a recessed portion 1121 and a peripheral portion 1122 located outside the recessed portion 1121, the recessed portion 1121 has a bottom portion 112a and a side portion 112b, and the bottom portion 112a and the peripheral portion 1122 are connected by the side portion 112b. As illustrated in FIG. 6, the side portion 112b of the recessed portion 1121 has an uneven surface to be configured so that light irradiated thereon is diffusely reflected, so that as illustrated in FIG. 7, in the process of exposing the photoresist when the conductive line L1 is formed, the light collected on the photoresist retaining portion 2011 on the first via hole V1 is avoided or reduced, so that the conductive line L1 across the first via hole V1 is not broken or thinned at the first via hole V1 to avoid poor dark spots as displayed.

In the embodiments of the present disclosure, the recessed portion 1121 can be regarded as a portion of the second conductive element 112 located within the first via hole V1. For example, the orthographic projection of the recessed portion 1121 on the base substrate BS overlaps with the orthographic projection of the first via hole V1 on the base substrate BS.

As illustrated in FIG. 6, the uneven surface of the side portion 112b of the recessed portion 1121 is the surface of the side portion 112b facing away from the base substrate BS. As illustrated in FIG. 6, the surface of the side portion 112b of the recessed portion 1121 close to the base substrate BS is also an uneven surface. For example, an uneven surface includes a plurality of protrusions, and a depression is located between adjacent protrusions.

The display substrate provided by the embodiments of the present disclosure, by changing the degree of roughness of the surface of the second conductive element 112 under the first via hole V1 of the first planarization layer 121, makes the light irradiated on the surface of the bowl-shaped portion of the second conductive element 112 to generate diffuse reflection during exposure, eliminate the concentration of light, and avoid the disconnection and thinning of the conductive lines caused by overexposure of the photoresist, thereby solving the problem of poor dark spots.

As illustrated in FIG. 8, the first planarization layer 121 has an uneven surface at the first via hole V1 to facilitate the formation of the side portion 112b of the second conductive element 112 with an uneven surface.

For example, as illustrated in FIG. 7 and FIG. 8, the first planarization layer 121 has an uneven surface at the position corresponding to the side portion 112b, on which the second conductive element 112 is conformably disposed.

For example, as illustrated in FIG. 6, the side portion 112b and the base substrate BS have an included angle θ. Correspondingly, as illustrated in FIG. 8, the portion of the first planarization layer 121 where the first via hole V1 is formed and the base substrate BS also have an included angle θ. In other words, the side portion 112b is inclined with respect to a main surface of the base substrate BS, and the portion of the first planarization layer 121 where the first via hole V1 is formed is inclined with respect to the main surface of the base substrate BS. The included angle θ is an acute angle. For example, the above-mentioned included angle θ is greater than or equal to 20 degrees and less than or equal to 80 degrees, but is not limited thereto. For example, the above-mentioned included angle θ is greater than or equal to 30 degrees and less than or equal to 60 degrees, but is not limited thereto. The embodiments of the present disclosure do not limit the value of the above-mentioned included angle. For example, because the side portion 112b may not be smooth or flat, the included angle between the side portion 112b and the base substrate BS may refer to the included angle between the extension trend of the side portion 112b and the base substrate BS, and the included angle between the side portion 112b and the base substrate BS may refer to the included angle between the connection line between two terminal points of the side portion 112b and the base substrate BS. For example, because the portion of the first planarization layer 121 where the first via hole V1 is formed may not be smooth or flat, the included angle between the portion of the first planarization layer 121 where the first via hole V1 is formed and the base substrate BS may refer to the included angle between the extension trend of the portion of the first planarization layer 121 where the first via hole V1 is formed and the base substrate BS, and the included angle between the portion of the first planarization layer 121 where the first via hole V1 is formed and the base substrate BS may refer to the included angle between the connection line between two terminal points of the portion of the first planarization layer 121 where the first via hole V1 is formed and the base substrate BS.

For example, as illustrated in FIG. 6, in some embodiments, the bottom portion 112a of the recessed portion 1121 refers to the portion of the recessed portion 1121 that is in contact with the first conductive element 111, and the side portion 112b of the recessed portion 1121 refers to the portion of the recessed portion 1121 that is in contact with the portion of the first planarization layer 121 that forms the first via hole, but is not limited thereto.

The figures of the embodiments of the present disclosure illustrate at least one of the first direction X, the second direction Y, and the third direction Z. The main surface of the base substrate BS is the surface on which various components are provided, the first direction X and the second direction Y are directions parallel to the main surface of the base substrate BS, and the third direction Z is a direction perpendicular to the main surface of the base substrate BS. For example, the first direction X and the second direction Y intersect. For further example, the first direction X is perpendicular to the second direction Y.

For example, as illustrated in FIG. 6, the peripheral portion 1122 is parallel to the base substrate BS. In the embodiments of the present disclosure, the peripheral portion 1122 can be regarded as a portion of the second conductive element 112 located outside the first via hole V1. For example, the orthographic projection of the peripheral portion 1122 on the base substrate BS does not overlap with the orthographic projection of the first via hole V1 on the base substrate BS.

For example, as illustrated in FIG. 6, the portion of the first planarization layer 121 has a flat surface except at the position of a sidewall of the first via hole V1. For example, as illustrated in FIG. 6, the bottom portion 112a of the second conductive element 112 is parallel to the peripheral portion 1122. That is, in some embodiments, the second conductive element 112 is provided with an uneven surface only at the position corresponding to the sidewall of the first via hole V1.

For example, the material of the second conductive element 112 includes metal, for example, the metal includes at least one of titanium, molybdenum, and aluminum, but is not limited thereto. For example, the material of the conductive line L1 includes a transparent conductive material, the above description can be referred to, and details are not repeated here.

Figure 9:
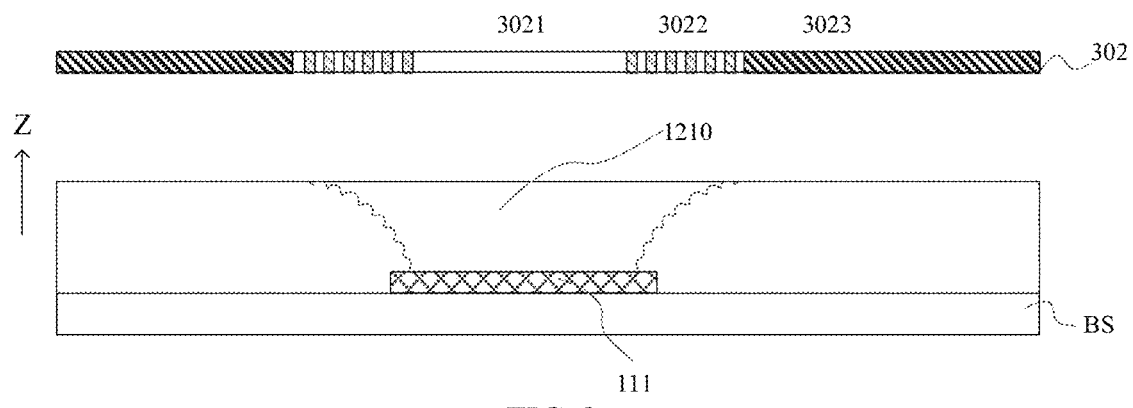
FIG. 9 is a schematic diagram of forming a first planarization layer in a process of fabricating a display substrate according to an embodiment of the present disclosure.

FIG. 9 is a schematic diagram of forming a first planarization layer in a process of fabricating a display substrate according to an embodiment of the present disclosure. As illustrated in FIG. 9, after the first conductive element 111 is formed on the base substrate BS, a first planarization film 1210 is formed, and the first planarization film 1210 is exposed by a half tone mask 302. After the exposure process, a development process is performed to form the first planarization layer 121 illustrated in FIG. 8. For example, as illustrated in FIG. 9, the half tone mask 302 includes a light-transmitting region 3021, an opaque region 3023 and a half tone region 3022, and the transmittance of the half tone region 3022 is between the transmittance of the light-transmitting region 3021 and the opaque region 3023. FIG. 9 illustrates the outline of the first planarization layer with dashed lines.

Figure 10A:
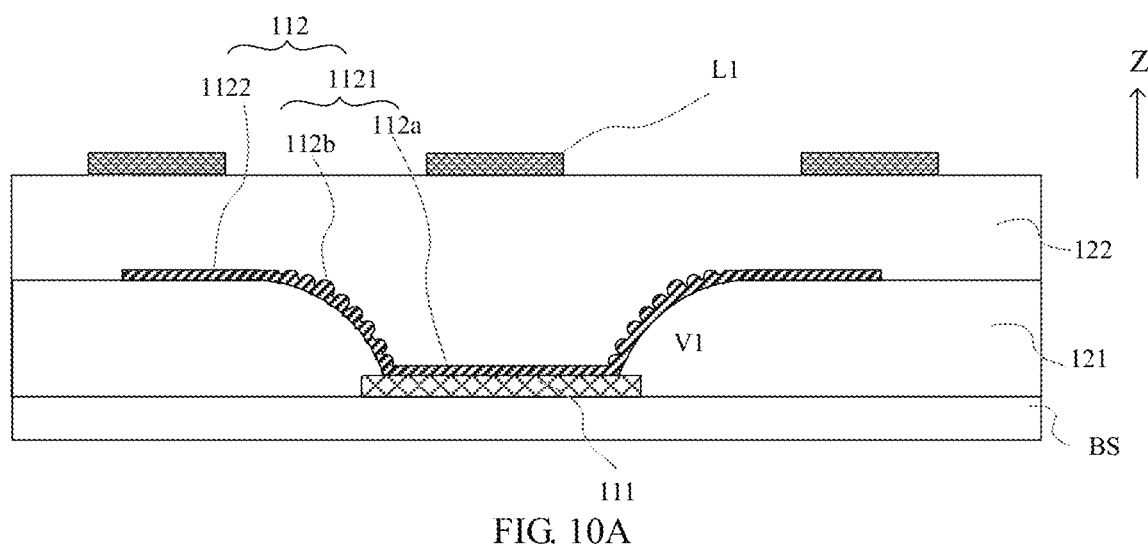
FIG. 10A is a schematic diagram of a display substrate according to an embodiment of the present disclosure.

FIG. 10A is a schematic diagram of a display substrate according to an embodiment of the present disclosure. As illustrated in FIG. 10A, the surface of the portion of the first planarization layer 121 where the first via hole V1 is formed is smooth, that is, the sidewall of the first planarization layer 121 where the first via hole V1 is formed is smooth, while is not uneven. Accordingly, the surface of the second conductive element 112 in contact with the first planarization layer 121 is also smooth. As illustrated in FIG. 10A, the surface of the side portion 112b of the second conductive element 112 facing away from the base substrate BS is uneven.

Figure 10B:
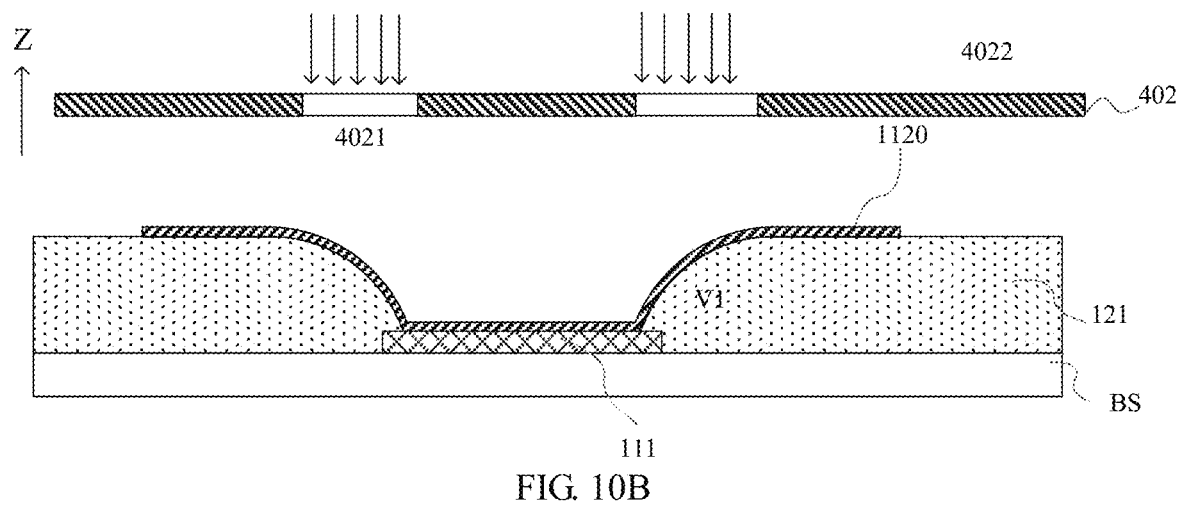
FIG. 10B is a schematic diagram of forming a second conductive element in the display substrate illustrated in FIG. 10A according to an embodiment of the present disclosure.

FIG. 10B is a schematic diagram of forming a second conductive element in the display substrate illustrated in FIG. 10A according to an embodiment of the present disclosure. For example, as illustrated in FIG. 10B, after an intermediate element 1120 is formed, the intermediate element 1120 is bombarded with ions. As illustrated in FIG. 10B, ions bombard the surface of the bowl-shaped structure of the intermediate element 1120 at the position corresponding to the first via hole V1 of the first planarization layer 121, so that the surface of the intermediate element 1120 becomes rough and uneven, and the second conductive element 112 illustrated the FIG. 10 is formed. As illustrated in FIG. 10B, in the ion bombardment process, the mask 402 is used as a mask so that a portion of the surface of the intermediate element 1120 becomes an uneven surface, while the rest of the surface of the intermediate element 1120 is smooth. As illustrated in FIG. 10B, the mask 402 includes a blocking region 4022 and a non-blocking region 4021. The non-blocking region 4021 corresponds to the sidewall of the first via hole V1 of the first planarization layer 121, and the blocking region 4022 corresponds to other positions.

Figure 10C:
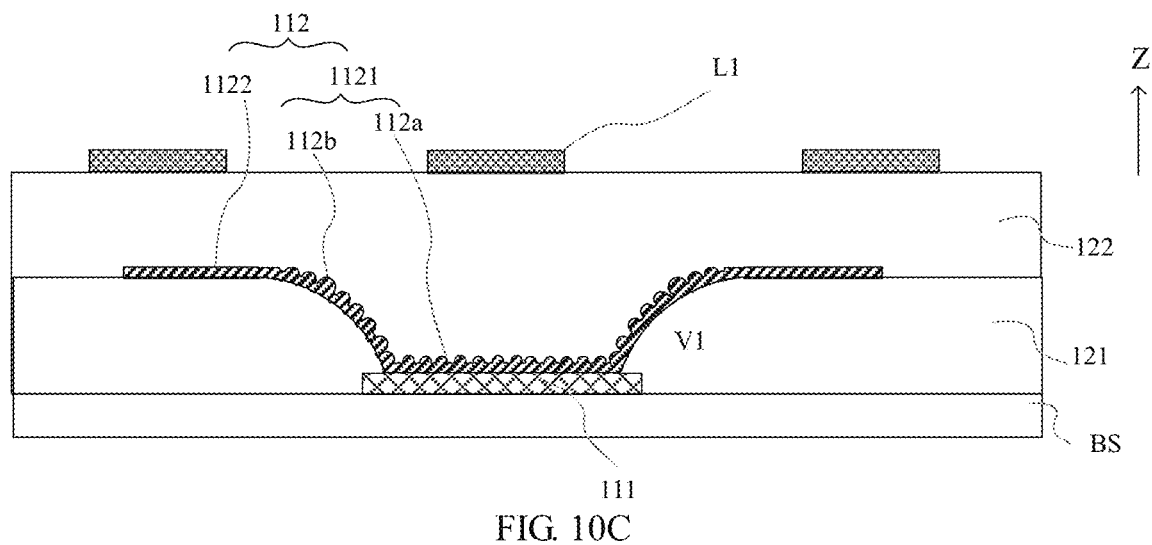
FIG. 10C is a schematic diagram of a display substrate according to another embodiment of the present disclosure.

FIG. 10C is a schematic diagram of a display substrate according to another embodiment of the present disclosure.

Compared with the display substrate illustrated in FIG. 10A, the bottom portion 112a of the second conductive element 112 in the display substrate illustrated in FIG. 10C also has an uneven and rough surface.

Figure 10D:
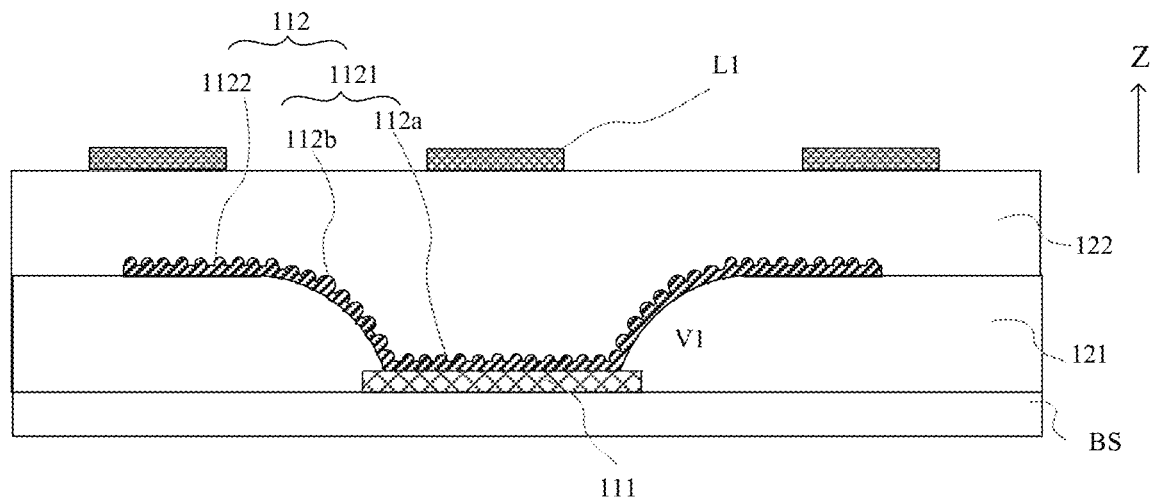
FIG. 10D is a schematic diagram of a display substrate according to another embodiment of the present disclosure.

FIG. 10D is a schematic diagram of a display substrate according to another embodiment of the present disclosure. Compared with the display substrate illustrated in FIG. 10A, the bottom portion 112a and the side portion 112b of the second conductive element 112 in the display substrate illustrated in FIG. 10D also have uneven and rough surfaces. For example, in the display substrate illustrated in FIG. 10D, the second conductive element 112 has uneven and rough surfaces at various positions, that is, as illustrated in FIG. 10D, the recessed portion 1121, the bottom portion 112a, the side portion 112b, and the peripheral portion 1122 of the second conductive element 112 all have uneven and rough surfaces. In the case where forming the second conductive element 112 of the display substrate illustrated in FIG. 10C, the non-blocking region 4021 of the mask corresponds to the bottom wall and sidewall of the first via hole V1 of the first planarization layer 121, and in the case where forming the second conductive element 112 of the display substrate illustrated in FIG. 10D, the mask can use the mask used for forming the intermediate element 1120.

Figure 11A:
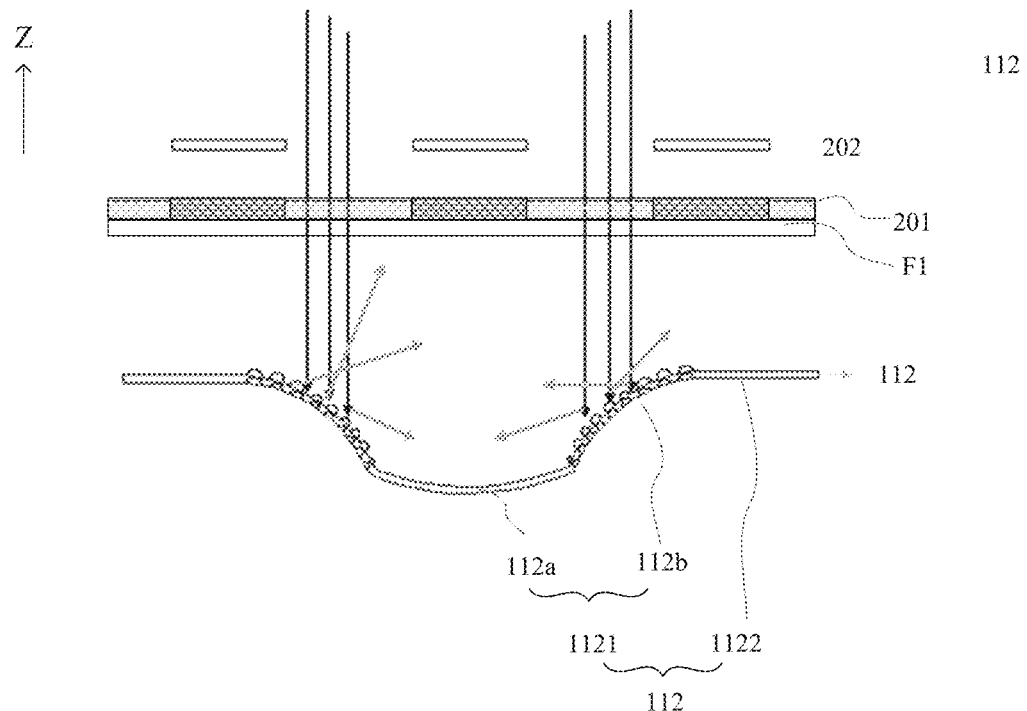
FIG. 11A is a schematic diagram of a second conductive element in a display substrate according to an embodiment of the present disclosure.
Figure 11B:
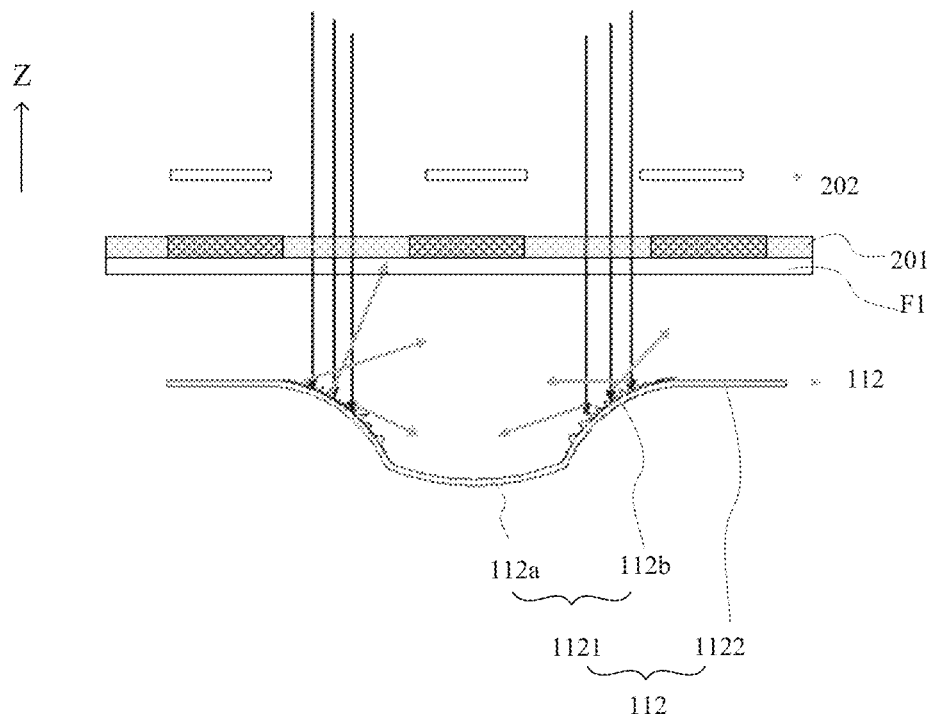
FIG. 11B is a schematic diagram of a second conductive element in a display substrate according to another embodiment of the present disclosure.

FIG. 11A is a schematic diagram of a second conductive element in a display substrate according to an embodiment of the present disclosure. FIG. 11B is a schematic diagram of a second conductive element in a display substrate according to another embodiment of the present disclosure. Compared with the second conductive element 112 illustrated in FIG. 11A, the lower surface of the side portion 112b of the second conductive element 112 illustrated in FIG. 11B is smooth, not uneven. Both the side portion 112b of the second conductive element 112 illustrated in FIG. 11A and FIG. 11B can play the role of diffuse reflection of the light irradiated thereon, so as to avoid the disconnection and thinning of the conductive lines.

Figure 11C:
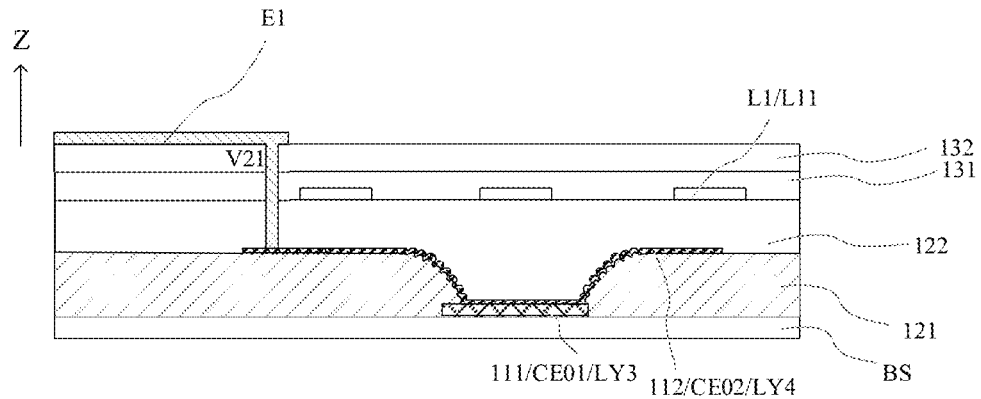
FIG. 11C is a schematic diagram of a partial structure of a display substrate according to an embodiment of the present disclosure.

FIG. 11C is a schematic diagram of a partial structure of a display substrate according to an embodiment of the present disclosure. As illustrated in FIG. 11C and FIG. 2, the first conductive element 111 is the connection electrode CE01 illustrated in FIG. 2, and the second conductive element 112 is the connection electrode CE02 illustrated in FIG. 2. The first electrode E1 of the light-emitting element of the first pixel unit is connected to the connection electrode CE02 through the via hole V21. That is, the connection electrode CE02 has an uneven and rough surface.

Figure 11D:
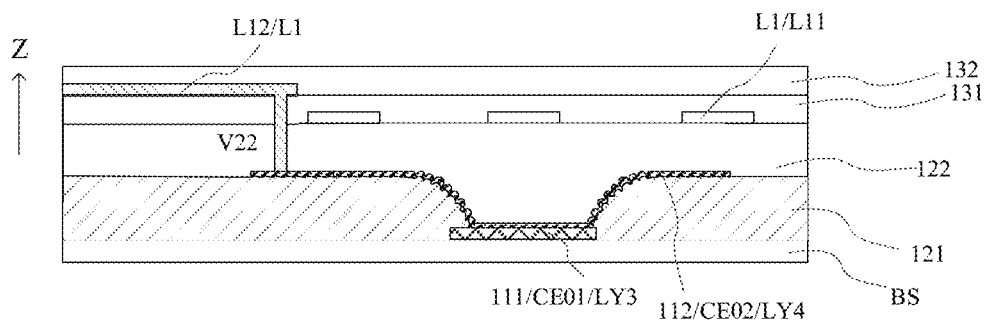
FIG. 11D is a schematic diagram of a partial structure of a display substrate according to an embodiment of the present disclosure.

FIG. 11D is a schematic diagram of a partial structure of a display substrate according to an embodiment of the present disclosure. As illustrated in FIG. 11D and FIG. 2, the first conductive element 111 is the connection electrode CE01 illustrated in FIG. 2, and the second conductive element 112 is the connection electrode CE02 illustrated in FIG. 2. The conductive line L1 is connected to the connection electrode CE02 through the via hole V22. That is, the connection electrode CE02 has an uneven and rough surface.

For example, referring to FIG. 2, FIG. 11C and FIG. 11D, the first conductive element 111 is located on the same layer as the connection electrode CE01, and the second conductive element 112 is located on the same layer as the connection electrode CE02. In this case, the first conductive element 111 and the connection electrode CE01 are the same element, and the second conductive element 112 and the connection electrode CE02 are the same element; or, the first conductive element 111 refers to the constant voltage line L0, and the second conductive element 112 refers to the shield electrode SE.

Figure 11E:
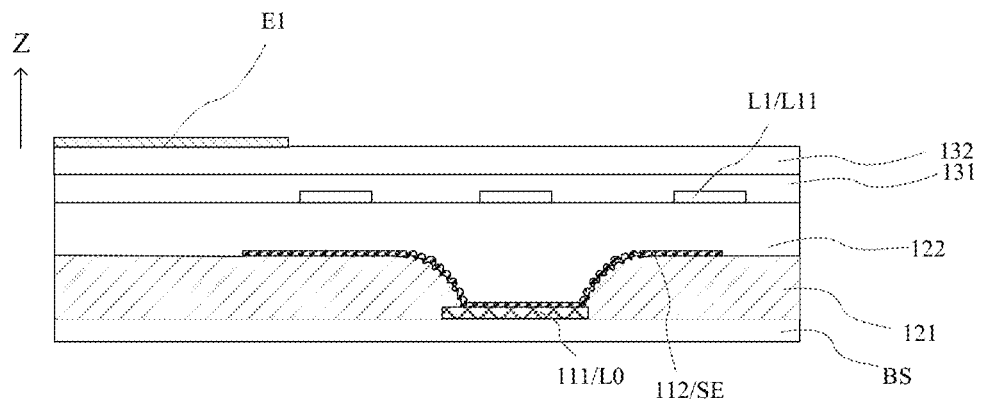
FIG. 11E is a schematic diagram of a partial structure of a display substrate according to an embodiment of the present disclosure.

FIG. 11E is a schematic diagram of a partial structure of a display substrate according to an embodiment of the present disclosure. As illustrated in FIG. 11E and FIG. 2, the first conductive element 111 is the constant voltage line L0 illustrated in FIG. 2, and the second conductive element 112 is the shield electrode SE illustrated in FIG. 2. That is, the shield electrode SE adopts a structure having an uneven and rough surface.

For example, referring to FIG. 2 and FIG. 11E, the first conductive element 111 is located on the same layer as the constant voltage line L0, and the second conductive element 112 is located on the same layer as the shield electrode SE. In this case, the first conductive element 111 and the constant voltage line L0 are the same element, and the second conductive element 112 and the shield electrode SE are the same element; or, the first conductive element 111 refers to the connection electrode CE01, and the second conductive element 112 refers to the connection electrode CE02.

Referring to FIG. 2, and FIG. 11C to FIG. 11E, the connection electrode CE02 and the shield electrode SE are located in a fourth conductive layer LY4, and the constant voltage line L0 and the connection electrode CE01 are located in a third conductive layer LY3.

Figure 11F:
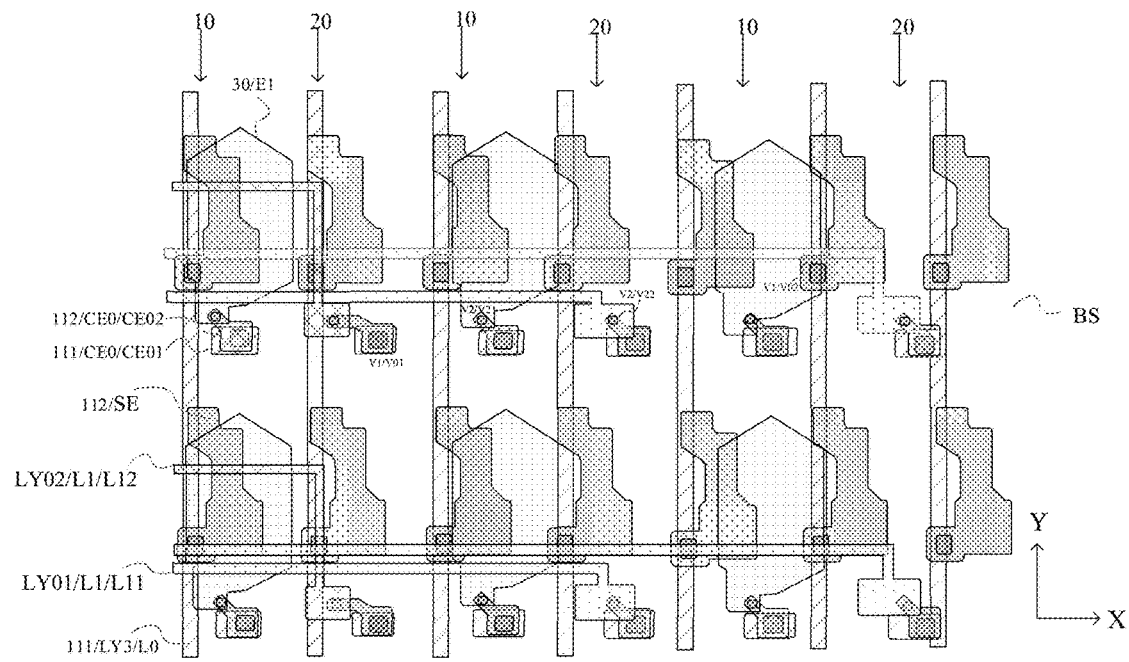
FIG. 11F is a schematic diagram of a partial structure of a display substrate according to an embodiment of the present disclosure.

FIG. 11F is a schematic diagram of a partial structure of a display substrate according to an embodiment of the present disclosure. For clarity of illustration, FIG. 11F only illustrates the conductive line L1 connected to the connection element CE0, the other conductive lines are not illustrated, and the other conductive lines can be referred to FIG. 2.

For example, in order to avoid disconnection or thinning of the conductive lines, the connection electrode CE02 or the shield electrode SE located in the fourth conductive layer LY4 in the display substrate adopts the above-mentioned structure with an uneven and rough surface. In some embodiments, as illustrated in FIG. 11F, the connection electrode CE02 and the shield electrode SE located in the fourth conductive layer LY4 in the display substrate both adopt the above-mentioned structure with an uneven and rough surface. That is, at least one of the connection electrode CE02 and the shield electrode SE located in the fourth conductive layer LY4 in the display substrate adopts the above-mentioned structure with an uneven and rough surface.

For example, the second connection electrode is recessed at the via hole where the second connection electrode is connected to the first connection electrode, so that the second connection electrode has a recessed portion and a peripheral portion located outside the recessed portion. The recessed portion of the second connection electrode has a bottom portion and a side portion, the bottom portion of the second connection electrode is connected with the peripheral portion of the second connection electrode through the side portion of the second connection electrode, and the side portion of the second connection electrode has an uneven surface to be configured to make light irradiated thereon be diffusely reflected.

For example, the shield electrode is recessed at the via hole where the shield electrode is connected to the constant voltage line, so that the shield electrode has a recessed portion and a peripheral portion located outside the recessed portion. The recessed portion of the shield electrode has a bottom portion and a side portion, the bottom portion of the shield electrode is connected with the peripheral portion of the shield electrode through the side portion of the shield electrode, and the side portion of the shield electrode has an uneven surface to be configured to make light irradiated thereon be diffusely reflected.

Of course, in the display substrate provided by some embodiments of the present disclosure, the shield electrode SE may not be provided, in this case, the first conductive element 111 is the connection electrode CE01, and the second conductive element 112 is the connection electrode CE02. In the display substrate provided by some embodiments of the present disclosure, the second conductive element 112 may also be other elements located in the fourth conductive layer LY4, and the elements can be connected to the elements of the first conductive layer LY1, the second conductive layer LY2 or the third conductive layer LY3 through via holes, in which case the elements in the fourth conductive layer LY4 may also have uneven and rough surfaces to avoid disconnection or thinning of the conductive lines L1 passing across the via holes. FIG. 11C to FIG. 11E further illustrate an insulating layer 131 and an insulating layer 132. The insulating layer 131 is provided between the second conductive line L12 and the first conductive line L11. The insulating layer 132 is provided between the second conductive line L12 and the first electrode E1 of the light-emitting element.

As illustrated in FIG. 11C to FIG. 11E, in some embodiments, the conductive line L1 is in contact with the upper surface of the second planarization layer 122, but not limited thereto. For example, the upper surface of the second planarization layer 122 refers to the surface of the second planarization layer 122 facing away from the base substrate BS.

As illustrated in FIG. 11C to FIG. 11E, in some embodiments, the second conductive element 112 is in contact with the upper surface of the first planarization layer 121, but not limited thereto. For example, the upper surface of the first planarization layer 121 refers to the surface of the first planarization layer 121 facing away from the base substrate BS.

In the display panel provided by the embodiments of the present disclosure, the shapes of protrusions and depressions in the uneven surface are not limited.

For example, referring to FIG. 1, the display substrate further includes a pixel unit 100, the pixel unit 100 includes a first pixel unit 101 and a second pixel unit 102, the pixel circuit 10 and the light-emitting element 30 of the first pixel unit 101 are located in the first display region R1, the pixel circuit 20 of the second pixel unit 102 is located in the first display region R1, the light-emitting element 40 of the second pixel unit 102 is located in the second display region R2, and the pixel circuit 20 of the second pixel unit 102 is connected to the light-emitting elements 40 of the second pixel unit 102 through the conductive line L1.

For example, referring to FIG. 1, the orthographic projection of the pixel circuit 10 of the first pixel unit 101 on the base substrate BS at least partially overlaps with the orthographic projection of the light-emitting element 30 of the first pixel unit 101 on the base substrate BS, and the orthographic projection of the pixel circuit 20 of the second pixel unit 102 on the base substrate BS dose not overlap with the orthographic projection of the light-emitting element 40 of the second pixel unit 102 on the base substrate BS.

Referring to FIG. 2, the orthographic projection of the conductive line L1 on the base substrate BS partially overlaps with the orthographic projection of the pixel circuit 10 of the first pixel unit 101 on the base substrate BS. The position of the shield electrode in FIG. 2 can be regarded as the position of the pixel circuit.

For example, referring to FIG. 1, the display substrate further includes a connection element CE0, and the pixel circuit of the pixel unit 100 is connected to the conductive line L1 or connected to the light emitting element 30 of the first pixel unit 101 through the connection element CE0.

For example, referring to FIG. 1 and FIG. 2, the second conductive element 112 includes a portion of the connection element CE0 that is connected to the conductive line L1, or, referring to FIG. 2, the second conductive element 112 includes a portion of the connection element CE0 that is connected to the light-emitting element 30 of the first pixel unit 101. For example, referring to FIG. 2, the connection element CE0 includes a connection electrode (a first connection electrode) CE01 and a connection electrode (a second connection electrode) CE02. The connection electrode CE01 and the connection electrode CE02 can be connected through a via hole penetrating the insulating layer. For example, the material of the connection electrode CE01 includes metal, and the material of the connection electrode CE02 includes metal. For example, in some embodiments, the first conductive element 111 illustrated in FIG. 3 is the connection electrode CE01 illustrated in FIG. 2, and the second conductive element 112 illustrated in FIG. 3 is the connection electrode CE02 illustrated in FIG. 2. As illustrated in FIG. 2, the connection electrode CE02 is connected to the connection electrode CE01 through the via hole V01. For example, in some embodiments, the first conductive element 111 illustrated in FIG. 3 is the constant voltage line L0, and the second conductive element 112 illustrated in FIG. 3 is the shield electrode SE illustrated in FIG. 2. As illustrated in FIG. 3, the shield electrode SE is connected to the constant voltage line L0 through the via hole V02.

For example, referring to FIG. 2, a plurality of conductive lines L1 are provided, and the orthographic projection of at least one of the plurality of conductive lines L1 on the base substrate BS overlaps with the orthographic projection of the first via hole V1 on the base substrate BS.

The display panels illustrated in FIG. 6, FIG. 10A, FIG. 10C, and FIG. 10D omit elements between the base substrate and the first conductive element. The display panel illustrated in FIG. 11A and FIG. 11B illustrates the structure of the second conductive element 112 and illustrates the diffuse reflection of the uneven surface avoiding affecting the photoresist retaining portion.

Figure 12A:
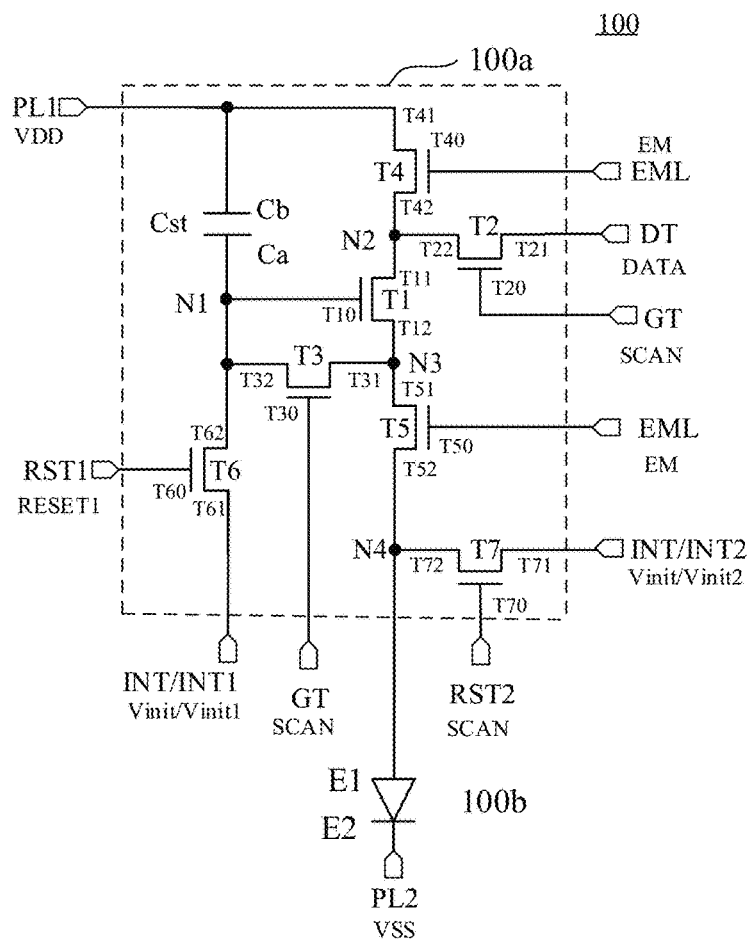
FIG. 12A is a schematic diagram of a pixel circuit in a display panel according to an embodiment of the present disclosure.
Figure 12B:
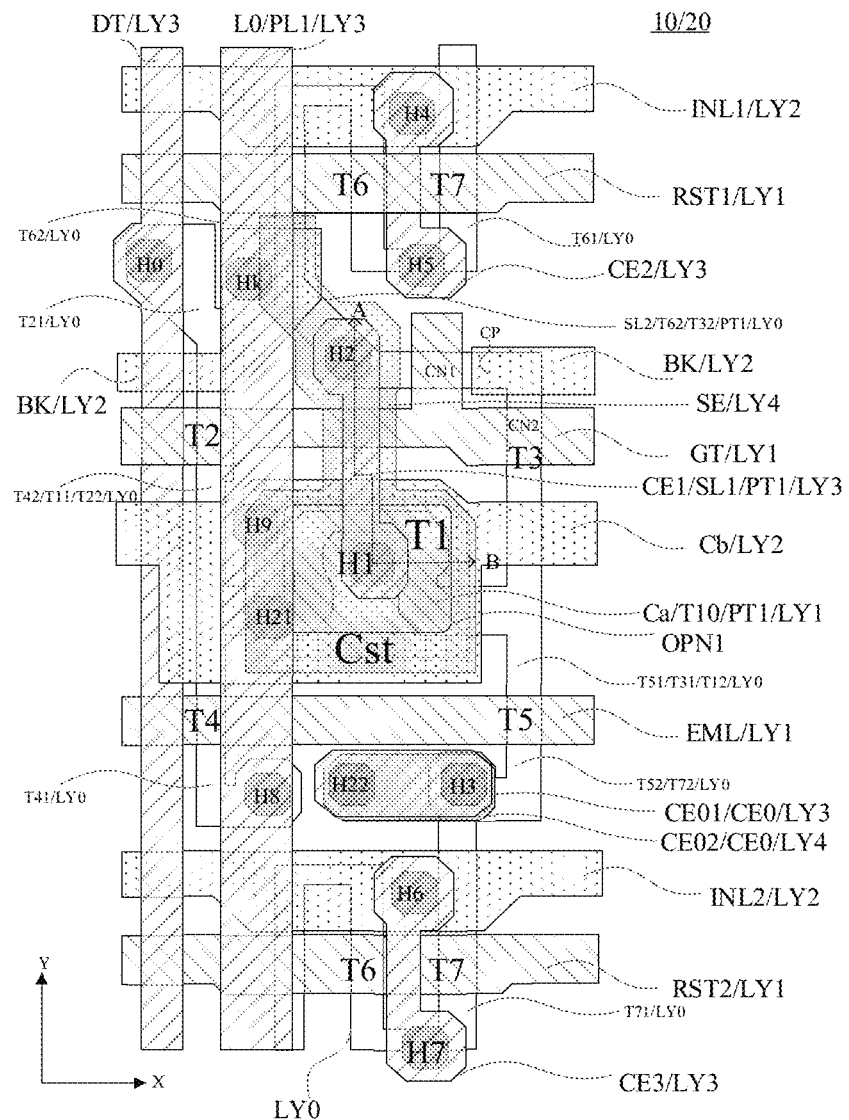
FIG. 12B is a layout diagram of a pixel circuit in a display panel according to an embodiment of the present disclosure.
Figure 12C:
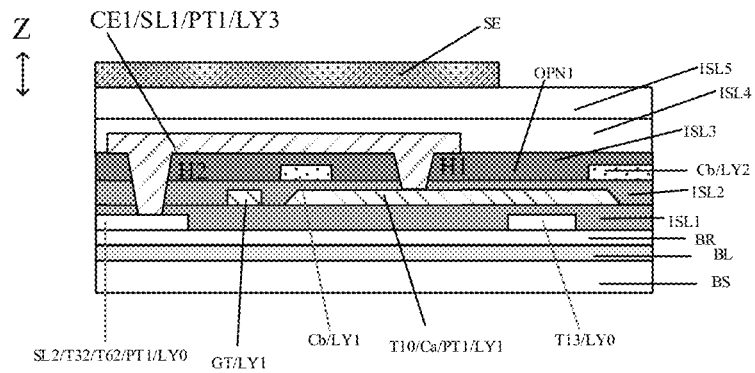
FIG. 12C is a cross-sectional view taken along the line A-B of FIG. 12B.

FIG. 12A is a schematic diagram of a pixel circuit in a display panel provided by an embodiment of the present disclosure. FIG. 12B is a layout diagram of a pixel circuit in a display panel provided by an embodiment of the present disclosure. FIG. 12C is a cross-sectional view taken along the line A-B of FIG. 12B.

The pixel circuit illustrated in FIG. 12A may be a low temperature polysilicon (LTPS) AMOLED pixel circuit.

FIG. 12 illustrates a pixel circuit of one pixel unit of the display panel, as illustrated in FIG. 12, the pixel unit 100 includes a pixel circuit 100a and a light-emitting element 100b, and the pixel circuit 100a is configured to drive the light-emitting element 100b. For example, the pixel circuit 100a is configured to provide the driving current to drive the light-emitting element 100b to emit light. For example, the light-emitting element 100b is an organic light emitting diode (OLED), and the light-emitting element 100b emits red light, green light, blue light, or white light under the driving of its corresponding pixel circuit 100a. The color of emitting light of the light-emitting element 100b can be determined according to the needs. The pixel circuit 100a includes the first pixel circuit 10 or the second pixel circuit 20 described above. The light-emitting element 100b includes the first light-emitting element 30 or the second light-emitting element 40 described above.

As illustrated in FIG. 12A and FIG. 12B, the pixel circuit 100a includes six switching transistors (T2-T7), one driving transistor T1, and one storage capacitor Cst. The six switching transistors are respectively a data writing transistor T2, a threshold compensation transistor T3, a first light-emitting control transistor T4, a second light-emitting control transistor T5, a first reset transistor T6, and a second reset transistor T7. The light-emitting element 100b includes a first electrode E1, a second electrode E2, and a light-emitting function layer located between the first electrode E1 and the second electrode E2. For example, the first electrode E1 is an anode, and the second electrode E2 is a cathode. Generally, the threshold compensation transistor T3 and the first reset transistor T6 reduce leakage current by adopting double-gate thin film transistors (TFT).

As illustrated in FIG. 12A and FIG. 12B, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. For example, in a row of pixel units, the second reset control signal line RST2 is connected to the gate line GT to be input the scan signal SCAN. Of course, the second reset control signal line RST2 can also be input a second reset control signal RESET2. A first initialization signal line INT1 is configured to provide a first initialization signal Vinit1 to the pixel unit 100. A second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are Vinit.

As illustrated in FIG. 12A and FIG. 12B, the driving transistor T1 is electrically connected to the light-emitting element 100b, and outputs a driving current to drive the light-emitting element 100b to emit light under the control of the scan signal SCAN, the data signal DATA, the first voltage signal VDD, and the second voltage signal VSS.

For example, the light-emitting element 100b includes an organic light emitting diode (OLED), and the light-emitting element 100b emits red light, green light, blue light, or white light under the driving of its corresponding pixel circuit 100a. For example, one pixel includes a plurality of pixel units. One pixel includes a plurality of pixel units that emit light of different colors. For example, one pixel includes a pixel unit that emits red light, a pixel unit that emits green light, and a pixel unit that emits blue light, but it is not limited to this. The number of pixel units includes in a pixel and the light output of each pixel unit can be determined according to needs.

For example, as illustrated in FIG. 12A and FIG. 12B, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 12A and FIG. 12B, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to the gate electrode T10 of the driving transistor T1.

For example, as illustrated in FIG. 12A and FIG. 12B, a gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistors T5 is connected to a first electrode E1 of the light-emitting element 100b.

As illustrated in FIG. 12A and FIG. 12B, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100b and is configured to reset the first electrode E1 of the light-emitting element 100b. The first initialization signal line INT1 is connected to the gate electrode of the driving transistor T1 through the first reset transistor T6. The second initialization signal line INT2 is connected to the first electrode E1 of the light-emitting element 100b through the second reset transistor T7. For example, the first initialization signal line INT1 and the second initialization signal line INT2 are connected to each other and are input with the same initialization signal, but it is not limited to this. In some embodiments, the first initialization signal line INT1 and the second initialization signal line INT2 may also be insulated from each other and configured to input signals respectively.

As illustrated in FIG. 12A and FIG. 12B, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100b. For example, as illustrated in FIG. 12A, a gate electrode T60 of the first reset transistor T6 is connected to the first reset control signal line RST1, and a gate electrode T70 of the second reset transistor T7 is connected to the second reset control signal line RST2.

As illustrated in FIG. 12A, the first power supply line PL1 is configured to provide the first voltage signal VDD to the pixel circuit 100a. The pixel circuit further includes the storage capacitor Cst, a first electrode Ca of the storage capacitor Cst is connected to the gate electrode T10 of the driving transistor T1, and a second electrode Cb of the storage capacitor Cst is connected to the first power supply line PL1.

For example, as illustrated in FIG. 12A, the second power supply line PL2 is connected to a second electrode E2 of the light-emitting element 100b.

FIG. 12A illustrates a first node N1, a second node N2, a third node N3, and a fourth node N4. For example, in some embodiments, referring to FIG. 12A, a capacitor is formed between the first node N1 and the conductive line L1, and a capacitor is formed between the conductive line L1 and the fourth node N4. The conductive line L1 is coupled with the first node N1 and the fourth node N4, respectively, resulting in brightness differences and display defects (for example, forming stripes (Mura)), which affects the display quality.

As illustrated in FIG. 12B, the driving transistor T1 includes the gate electrode T10. Referring to FIG. 12B and FIG. 12C, the second electrode Cb of the storage capacitor Cst has an opening OPN1, and one terminal of the connecting electrode CE1 is connected to the gate electrode T10 of the driving transistor T1 through the opening OPN1. The connection electrode CE1 may also be referred to as a first gate signal line SL1. As illustrated in FIG. 12B, the first gate signal line SL1 is connected to the gate electrode T10 of the driving transistor T1.

As illustrated in FIG. 12B, the first gate signal line SL1 is connected to the second gate signal line SL2. The gate electrode T10 of the driving transistor T1, the first gate signal line SL1, and the second gate signal line SL2 constitute a gate signal portion PT1. The potentials on the gate signal portion PT1 are the same. Of course, in other embodiments, the second gate signal line SL2 may not be provided, in this case, the gate electrode T10 of the driving transistor T1 and the first gate signal line SL1 constitute the gate signal portion PT1. For example, the second gate signal line SL2 is the second electrode T62 of the first reset transistor T6.

Referring to FIG. 12B and FIG. 12C, in order to stabilize the potentials on the gate signal portion PT1, the display panel provided by the embodiment of the present disclosure provides a shield electrode SE and a constant voltage line L0, and the constant voltage line L0 is configured to provide a constant voltage to the pixel circuit. The shield electrode SE is connected to the constant voltage line L0, so that the voltage on the shield electrode SE is stable and can play a shielding role to prevent the conductive line L1 from affecting the potentials on the gate signal portion PT1. The orthographic projection of the first gate signal line SL1 on the base substrate BS falls within the orthographic projection of the shield electrode SE on the base substrate BS.

Referring to FIG. 12B, in order to make the shield electrode play a better shielding effect and increase the shielding amount, the orthographic projection of the first gate signal line SL1 on the base substrate BS completely falls within the orthographic projection of the shield electrode SE on the base substrate BS.

For example, in order to reduce display defects (mura) and improve the display effect, the distance between a boundary of the orthographic projection of the first gate signal line SL1 on the base substrate BS and a boundary of the orthographic projection of the shield electrode SE on the base substrate BS is greater than or equal to 1.75 µm. Because the area of the region occupied by the pixel unit is limited, the distance that the shield electrode SE exceeds the first gate signal line SL1 is limited. For example, in some embodiments, in order to obtain a better shielding effect, the distance between the boundary of the orthographic projection of the first gate signal line SL1 on the base substrate BS and the boundary of the orthographic projection of the shield electrode SE on the base substrate BS is greater than or equal to 2.33 µm.

As illustrated in FIG. 12B, the display panel further includes a block BK, and the block BK is connected to the first power supply line PL1. The threshold compensation transistor T3 includes a first channel CN1 and a second channel CN2, and the first channel CN1 and the second channel CN2 are connected by a conductive connection portion CP. The orthographic projection of the block BK on the base substrate BS at least partially overlaps with the orthographic projection of the conductive connection portion CP of the threshold compensation transistor T3 on the base substrate BS. As illustrated in FIG. 12B, the block BK of the pixel unit in the adjacent column is used to shield the conductive connection portion CP of the threshold compensation transistor T3 of the pixel unit in the current column.

For example, as illustrated in FIG. 12B, in the case where the display panel includes the second gate signal line SL2, the second gate signal line SL2 is connected to the first gate signal line SL1, and the orthographic projection of the second gate signal line SL2 on the base substrate BS falls within the orthographic projection of the block BK on the base substrate BS. For further example, the boundary of the orthographic projection of the block BK on the base substrate BS exceeds the boundary of the orthographic projection of the second gate signal line SL2 on the base substrate BS. For example, the boundary of the orthographic projection of the block BK on the base substrate BS exceeds the boundary of the orthographic projection of the second gate signal line SL2 on the base substrate BS by a distance greater than or equal to 1.75 µm. For example, the boundary of the orthographic projection of the block BK on the base substrate BS exceeds the boundary of the orthographic projection of the second gate signal line SL2 on the base substrate BS by a distance greater than or equal to 2.33 µm. Of course, in other embodiments, the shield electrode SE is also used to replace the role of the block BK, or the orthographic projection of the second gate signal line SL2 on the base substrate BS not only falls within the orthographic projection of the block BK on the base substrate BS, but also falls within the orthographic projection of the shield electrode SE on the base substrate BS.

For example, the material of the first gate signal line SL1 is different from the material of the second gate signal line SL2. For example, the material of the first gate signal line SL1 includes metal, and the material of the second gate signal line SL2 includes a conductive material formed by conducting semiconductor material.

For example, as illustrated in FIG. 12B, in order to save wiring, the first power supply line PL1 is used as the constant voltage line L0. In other embodiments, in order to save wiring, the first initialization signal line INL1 is also used as the constant voltage line or the second initialization signal line INL2 is also used as the constant voltage line. Examples of the constant voltage line L0 are not limited to the first power supply line PL1, the first initialization signal line INL1, and the second initialization signal line INL2, and any signal line that provides a constant voltage in the pixel circuit can be used as the constant voltage line L0. The embodiment of the present disclosure takes the case where the first power supply line PL1 is used as the constant voltage line L0 as an example for description, and in the case where a signal line that provides a constant voltage other than the first power supply line PL1 is used as the constant voltage line L0, the shape of the shield electrode SE is adjusted so that it is connected to the signal line that provides a constant voltage.

For example, in some embodiments, the pixel unit includes a pixel circuit and a light-emitting element, the pixel circuit is configured to drive the light-emitting element, the pixel circuit includes a driving transistor, and the driving transistor includes a gate electrode. The display substrate further includes a first gate signal line, a constant voltage line, and a shield electrode. The first gate signal line is connected to the gate electrode of the driving transistor. The constant voltage line is configured to provide a first constant voltage to the pixel circuit. The shield electrode is connected to the constant voltage line, and an orthographic projection of the first gate signal line on the base substrate falls within an orthographic projection of the shield electrode on the base substrate. For example, the second conductive element 112 includes a portion of the shield electrode SE connected to the constant voltage line L0.

For example, the orthographic projection of the conductive line L1 on the base substrate BS partially overlaps with the orthographic projection of the pixel circuit (the first pixel circuit 10) of the first pixel unit 101 on the base substrate BS. For example, the shield electrode SE is located between the conductive line L1 and the first gate signal line SL1. In the embodiments of the present disclosure, after the pixel circuit is formed, the shield electrode SE is formed, then the conductive line L1 is formed, and then the light-emitting element is formed, so that the shield electrode SE is located between the conductive line L1 and the first gate signal line SL1, and the shield electrode SE is located between the conductive line L1 and the gate electrode T10 of the driving transistor.

For example, the orthographic projection of the conductive line L1 on the base substrate BS partially overlaps with the orthographic projection of the first gate signal line SL1 in the pixel circuit of the first pixel unit 101 on the base substrate BS.

Referring to FIG. 12C and FIG. 12B, a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3. The third conductive layer LY3 includes a connection electrode CE01, and the connection electrode CE01 is connected to the second electrode T52 of the second light-emitting control transistor T5 through a via hole H3 penetrating the first insulating layer ISL1, the second insulating layer ISL2, and the third insulating layer ISL3. A fourth insulating layer and a fifth insulating layer are disposed on the third conductive layer LY3, and a fourth conductive layer is disposed on the fourth insulating layer and the fifth insulating layer. The fourth conductive layer LY4 includes a connection electrode CE02, and the connection electrode CE02 is connected to the connection electrode CE01 through a via hole H22 penetrating the fourth insulating layer and the fifth insulating layer. A sixth insulating layer is disposed on the fourth conductive layer LY4, and the light-emitting element 100b (the first light-emitting element 30) is connected to the connection electrode CE02 through a via hole penetrating the sixth insulating layer. The light-emitting element 100b includes a first electrode E1, a second electrode E2, and a light-emitting function layer located between the first electrode E1 and the second electrode E2. For example, the connection element CE0 includes the connection electrode CE01 and the connection electrode CE02.

As illustrated in FIG. 12B, one terminal of the connection electrode CE1 is connected to the gate electrode T10 of the driving transistor T1 through a via hole H1, and the other terminal of the connection electrode CE1 is connected to the second electrode T62 of the first reset transistor T6 through a via hole H2. One terminal of the connection electrode CE2 is connected to the first initialization signal line INL1 through a via hole H4, and the other terminal of the connection electrode CE2 is connected to the first electrode T61 of the first reset transistor T6 through a via hole H5. One terminal of the connection electrode CE3 is connected to the second initialization signal line INL2 through a via hole H6, and the other terminal of the connection electrode CE3 is connected to the first electrode T71 of the second reset transistor T7 through a via hole H7. The first power supply line PL1 is connected to the first electrode T41 of the first light-emitting control transistor T4 through a via hole H8. The first power supply line PL1 is connected to the second electrode Cb of the storage capacitor Cst through a via hole H9. The first power supply line PL1 is connected to the block BK through a via hole Hk. The data line DT is connected to the first electrode T21 of the data writing transistor T2 through a via hole H0.

For example, in the manufacturing process of the display panel, a self-aligned process is adopted, and a semiconductor patterned layer is subject to a conductor process by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is conducted, and a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain electrode region (the second electrode T72) of the second reset transistor T7 are formed. The portion of the semiconductor pattern layer covered by the first conductive layer LY1 retains semiconductor characteristics, and can form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. For example, as illustrated in FIG. 12B, the second electrode T72 of the second reset transistor T7 and the second electrode T52 of the second light-emitting control transistor T5 are formed as an integrated structure. The first electrode T51 of the second light-emitting control transistor T5, the second electrode T12 of the driving transistor T1, and the first electrode T31 of the threshold compensation transistor T3 are formed as an integrated structure. The first electrode T11 of the driving transistor T1, the second electrode T22 of the data writing transistor T2, and the second electrode T42 of the first light-emitting control transistor T4 are formed as an integrated structure. The second electrode T32 of the threshold compensation transistor T3 and the second electrode T62 of the first reset transistor T6 are formed as an integrated structure. In some embodiments, as illustrated in FIG. 12B, the first electrode T71 of the second reset transistor T7 and the first electrode T61 of the first reset transistor T6 are formed as an integrated structure.

For example, the channel regions of the transistors used in the embodiments of the present disclosure adopt monocrystalline silicon, polycrystalline silicon (such as low temperature polysilicon), or metal oxide semiconductor materials (such as IGZO, AZO, etc.). In one embodiment, the transistors are all P-type low temperature polysilicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, the channel material of the transistor is metal oxide semiconductor material (such as IGZO, AZO, etc.). The metal oxide semiconductor thin film transistor has a lower leakage current, which can help reduce the leakage current of the gate electrode of the driving transistor T1.

For example, the transistors adopted in the embodiments of the present disclosure include various structures, such as a top-gate type, a bottom-gate type, or a dual-gate structure. In one embodiment, the threshold compensation transistor T3 and the first reset transistor T6, which are directly connected to the gate electrode of the driving transistor T1, are dual-gate thin film transistors, which can help reduce the leakage current of the gate electrode of the driving transistor T1.

For example, the display panel further includes a pixel definition layer and a spacer. The pixel definition layer has an opening, and the opening is configured to limit the light-emitting region (light exit region, effective light-emitting region) of the pixel unit. The spacer is configured to support a fine metal mask when forming the light-emitting function layer.

For example, the opening of the pixel definition layer is the light exit region of the pixel unit. The light-emitting functional layer is located on the first electrode E1 of the light-emitting element 100b, and the second electrode E2 of the light-emitting element 100b is located on the light-emitting functional layer. For example, an encapsulation layer is disposed on the light-emitting element 100b. The encapsulation layer includes a first encapsulation layer, a second encapsulation layer, and a third encapsulation layer. For example, the first encapsulation layer and the third encapsulation layer are inorganic material layers, and the second encapsulation layer is an organic material layer. For example, the first electrode E1 is the anode of the light-emitting element 100b, and the second electrode E2 is the cathode of the light-emitting element 100b, which is not limited thereto.

For example, as illustrated in FIG. 12B, the orthographic projection of the gate electrode T10 of the driving transistor T1 on the base substrate BS falls within the orthographic projection of the shield electrode SE on the base substrate BS.

For example, as illustrated in FIG. 12B, in the case where the display panel includes the second gate signal line SL2, the second gate signal line SL2 is connected to the first gate signal line SL1, and the orthographic projection of the second gate signal line SL2 on the base substrate BS also falls within the orthographic projection of the shield electrode SE on the base substrate BS. For further example, the boundary of the orthographic projection of the shield electrode SE on the base substrate BS exceeds the boundary of the orthographic projection of the second gate signal line SL2 on the base substrate BS. For example, the boundary of the orthographic projection of the shield electrode SE on the base substrate BS exceeds the boundary of the orthographic projection of the second gate signal line SL2 on the base substrate BS by a distance greater than or equal to 1.75 μm. For example, the boundary of the orthographic projection of the shield electrode SE on the base substrate BS exceeds the boundary of the orthographic projection of the second gate signal line SL2 on the base substrate BS by a distance greater than or equal to 2.33 μm.

For example, as illustrated in FIG. 12B, the orthographic projections of the gate electrode T10 of the driving transistor T1, the first gate signal line SL1, and the second gate signal line SL2 on the base substrate BS all fall within the orthographic projection of the shield electrode SE on the base substrate BS.

For example, as illustrated in FIG. 12B, the orthographic projection of the shield electrode SE on the base substrate BS partially overlaps with the orthographic projection of the second gate signal line SL2 on the base substrate BS, and the orthographic projection of the block BK on the base substrate BS partially overlaps with the orthographic projection of the second gate signal line SL2 on the base substrate BS. Thus, in the display panel illustrated in FIG. 12B, the shield electrode SE and the block BK form a double-layer shield for the second gate signal line SL2.

For example, as illustrated in FIG. 12B, the orthographic projection of the shield electrode SE on the base substrate BS partially overlaps with the orthographic projection of the block BK on the base substrate BS.

Of course, in other embodiments, the block BK may not be provided, or the orthographic projection of the block BK on the base substrate BS does not overlap with the orthographic projection of the second gate signal line SL2 on the base substrate BS.

For example, as illustrated in FIG. 12B, the orthographic projection of the block BK on the base substrate BS partially overlaps with the orthographic projection of the second gate signal line SL2 on the base substrate BS, and the orthographic projection of the shield electrode SE on the base substrate BS partially overlaps with the orthographic projection of the first gate signal line SL1 on the base substrate BS, so that the block BK and the shield electrode SE jointly function as a shield for the gate signal portion PT1. Of course, in other embodiments, the block BK may not be provided, or the orthographic projection of the block BK on the base substrate BS dose not overlap with the orthographic projection of the second gate signal line SL2 on the base substrate BS.

For example, as illustrated in FIG. 12B, the block BK on the left extends to a pixel unit on the left side of the pixel unit illustrated in the figure, in order to shield the conductive connection portion CP of the threshold compensation transistor T3, while the block BK on the right is extended from the block BK connected to a pixel unit on the right side of the pixel unit illustrated in the figure.

As illustrated in FIG. 12B, the channel of each transistor as well as the first electrode and the second electrode on both sides of the channel are located in the active layer LY0. The first reset control signal line RST1, the gate line GT, the gate electrode T10 of the driving transistor (the first electrode Ca of the storage capacitor Cst), the light-emitting control signal line EML and the second reset control signal line RST2 are located in the first conductive layer LY1. The first initialization signal line INL1, the second electrode Cb of the storage capacitor Cst, and the second initialization signal line INL2 are located in the second conductive layer LY2. The data line DT, the first power supply line PL1, the connection electrode CE1, the connection electrode CE2, the connection electrode CE3, and the connection electrode CE01 are located in the third conductive layer LY3. The shield electrode SE is located in the fourth conductive layer LY4.

As illustrated in FIG. 12B, the first initialization signal line INL1, the first reset control signal line RST1, the gate line GT, the light-emitting control signal line EML, the second initialization signal line INL2, and the second reset control signal lines RST2 all extend along the first direction X. As illustrated in FIG. 12B, the data line DT and the first power supply line PL1 both extend along the second direction Y.

In the embodiments of the present disclosure, an orthographic projection of an element A on the base substrate BS falls within an orthographic projection of an element B on the base substrate BS means that the orthographic projection of the element A on the base substrate BS completely falls into the orthographic projection of the element B on the base substrate BS, that is, the orthographic projection of the element B on the base substrate BS covers the orthographic projection of the element A on the base substrate BS, and the area of the orthographic projection of the element A on the base substrate BS is less than or equal to the area of the orthographic projection of the element B on the base substrate BS.

For example, in some embodiments of the present disclosure, each pixel circuit 100a is provided with the shield electrode SE described above. That is, both the first pixel circuit 10 of the first pixel unit 101 and the second pixel circuit 20 of the second pixel unit 102 are provided with the shield electrode SE described above. But the present disclosure is not limited to this, for example, in other embodiments, no shield electrode SE is provided in each pixel circuit 100a.

For example, the transistors in the pixel circuit of the embodiment of the present disclosure are all thin film transistors. For example, the first conductive layer LY1, the second conductive layer LY2, the third conductive layer LY3, and the fourth conductive layer LY4 are all made of metal material. For example, the first conductive layer LY1 and the second conductive layer LY2 are formed of metal material such as nickel and aluminum, etc., but are not limited thereto. For example, the third conductive layer LY3 and the fourth conductive layer LY4 are formed of material such as titanium, molybdenum, aluminum, etc., but are not limited thereto. For example, the third conductive layer LY3 and the fourth conductive layer LY4 are respectively a structure formed by three sub-layers of Ti/AL/Ti, but are not limited thereto. For example, the base substrate is a glass substrate or a polyimide substrate, but it is not limited to this, and can be selected as required. For example, the buffer layer BL, the isolation layer BR, the first insulating layer ISL1, the second insulating layer ISL2, the third insulating layer ISL3, the fourth insulating layer IS4, the fifth insulating layer ISL5, the sixth insulating layer ISL6, the insulating layer 131 and the insulating layer 132 are all made of insulating material. The materials of the first electrode E1 and the second electrode E2 of the light-emitting element can be selected as required. In some embodiments, the first electrode E1 adopts at least one of transparent conductive metal oxide and silver, but it is not limited thereto. For example, the transparent conductive metal oxide includes indium tin oxide (ITO), but is not limited thereto. For example, the first electrode E1 may adopt a structure in which three sub-layers of ITO-Ag-ITO are arranged. In some embodiments, the second electrode E2 adopts a low work function metal, for example at least one of magnesium and silver, but is not limited thereto.

For example, the fourth insulating layer IS4 and the fifth insulating layer ISL5 in FIG. 12C correspond to the first planarization layer 121, and the sixth insulating layer mentioned above is the second planarization layer 122. In other embodiments, the fourth insulating layer IS4 may also be omitted, that is, the fifth insulating layer ISL5 corresponds to the first planarization layer 121. The first planarization layer 121 and the second planarization layer 122 may include a plurality of sub-layers respectively.

For example, referring to the layout diagrams and the cross-sectional views of the embodiments of the present disclosure, the display panel provided by at least one embodiment of the present disclosure can be manufactured by the following method.

(1) The buffer layer BL and the isolation layer BR are formed on the base substrate BS.
(2) A semiconductor film is formed on the isolation layer BR.
(3) The semiconductor film is patterned to form a semiconductor pattern layer.
(4) A first insulating film is formed on the semiconductor pattern layer.
(5) A first conductive film is formed on the first insulating film, and the first conductive film is patterned to form the first conductive layer LY1.
(6) The semiconductor pattern layer is doped by using the first conductive layer LY1 as a mask, so as to form the active layer LY0.
(7) A second insulating film is formed on the first conductive layer LY1.
(8) A second conductive film is formed on the second insulating layer ISL2, and the second conductive film is patterned to form the second conductive layer LY2.
(9) A third insulating film is formed on the second conductive layer LY2.

(10) At least one of the first insulating film, the second insulating film, and the third insulating film is patterned to simultaneously form via holes, the first insulating layer ISL1, the second insulating layer ISL2, and the third insulating layer ISL3.

(11) A third conductive film is formed, and the third conductive film is patterned to form the third conductive layer LY3. The components in the third conductive layer LY3 are connected to the components located under the third conductive layer LY3 through the via holes.

(12) A fourth insulating film and a fifth insulating film are formed, and the fourth insulating film and the fifth insulating film are patterned to simultaneously form via holes, the fourth insulating layer and the fifth insulating layer.

(13) A fourth conductive film is formed, and the fourth conductive film is patterned to form the fourth conductive layer LY4.

(14) At least one insulating layer is formed and at least one transparent conductive layer is formed, and the transparent conductive layer includes the conductive lines L1.

(15) The first electrode E1 of the light-emitting element is formed.

(16) The pixel definition layer PDL and the spacer PS are formed.

(17) The light-emitting function layer is formed.

(18) The second electrode E2 of the light-emitting element is formed.

(19) The encapsulation layer is formed.

Of course, in the display panel provided by the embodiments of the present disclosure, the shield electrode SE may not be provided.

In the embodiments of the present disclosure, the first conductive layer LY1 may be referred to as a first gate layer, the second conductive layer LY2 may be referred to as a second gate layer, the third conductive layer LY3 may be referred to as a first source-drain layer, and the conductive layer LY4 may be referred to as a second source-drain layer.

At least one embodiment of the present disclosure provides a display device including any one of the above-mentioned display substrates.

Figure 13A:
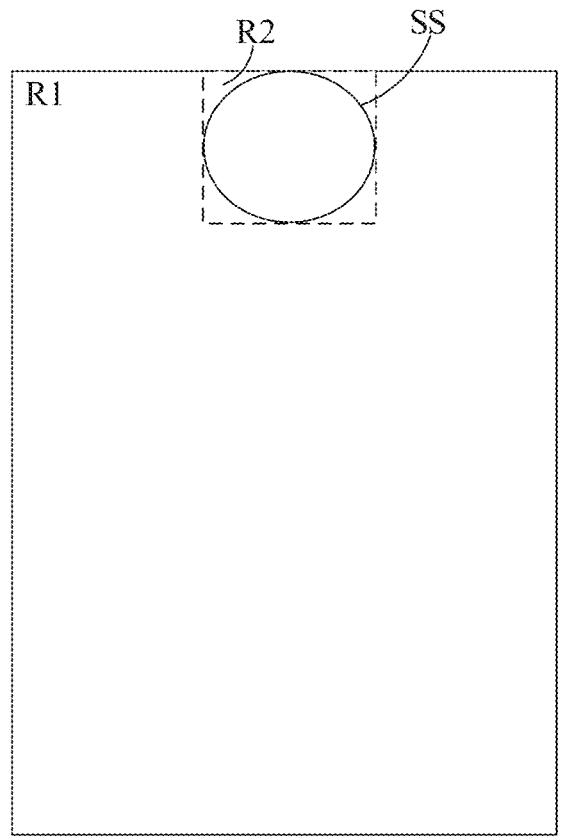
FIG. 13A and FIG. 13B are schematic diagrams of a display device according to an embodiment of the present disclosure.
Figure 13B:
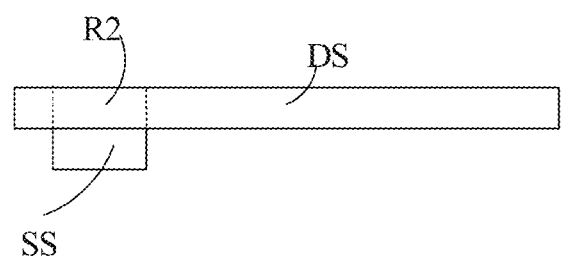

FIG. 13A and FIG. 13B are schematic diagrams of a display device provided by an embodiment of the disclosure. As illustrated in FIG. 13A and FIG. 13B, a sensor SS is located on one side of a display substrate DS and located in a second display region R2. The ambient light propagates through the second display region R2 and can be sensed by the sensor SS. As illustrated in FIG. 13B, the side of the display panel where the sensor SS is not provided is a display side, and images can be displayed on the display side. For example, the sensor includes a photosensitive sensor, and the photosensitive sensor is located at one side of the display panel. In this type of display device, hardware such as a photosensitive sensor (for example, a camera) can be disposed in the light-transmitting display region. Because there is no need to punch holes, it is possible to realize a true full screen.

For example, the second display region R2 is a rectangle, and the area of the orthographic projection of the sensor SS on the base substrate BS is smaller than or equal to the area of the inscribed circle of the second display region R2. That is, the size of the region where the sensor SS is located is smaller than or equal to the size of the inscribed circle of the second display region R2. For example, the size of the region where the sensor SS is located is equal to the size of the inscribed circle of the second display region R2, that is, the shape of the region where the sensor SS is located is a circle. Of course, in some embodiments, the second display region R2 may also be other shapes than rectangle, such as circle or ellipse.

For example, the display device is a full-screen display device with an under-screen camera. For example, the display device includes an OLED or a product including an OLED. For example, the display device includes products or components with display function that including the above-mentioned display panel, such as a TV, a digital camera, a mobile phone, a watch, a tablet computer, a laptop computer, a navigator, and the like.

For example, the embodiments of the present disclosure are not limited to the specific pixel circuit illustrated in FIG. 12A, and other pixel circuits that can realize compensation for the driving transistor may be adopted. Based on the description and teaching of the implementation manner in the present disclosure, other setting manners that a person of ordinary skill in the art can easily think of without creative work fall within the protection scope of the present disclosure.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

In the related technology, the pixel circuit (including the first pixel circuit 10 and the second pixel circuit 20) and the first light-emitting element 30 have the same pitch. For example, the typical width is about 30 micrometers (μm) to 32 μm, and the length is about 60 μm to 65 μm. In the embodiments of the present disclosure, in order to provide sufficient space for the setting of the second pixel circuit 20 without reducing the number of pixels in the first display region R1, it is possible to compress each pixel circuit along the first direction X (e.g., the gate line extension direction, which can also be referred to as horizontal), so that the width of the pixel circuit in the first direction is smaller than the width of the first light-emitting element 30. Or, the first light-emitting element 30 is extended along the first direction X, so that the width of the first light emitting element 30 in the first direction X is larger than the width of the first pixel circuit 10. In this way, in the case where the size of the base substrate BS is the same, there can be an extra spare region in the first display region R1, and correspondingly, the second pixel circuit 20 for driving the second light-emitting element 40 located in the second display region R2 is provided in the spare region.

Figure 14:
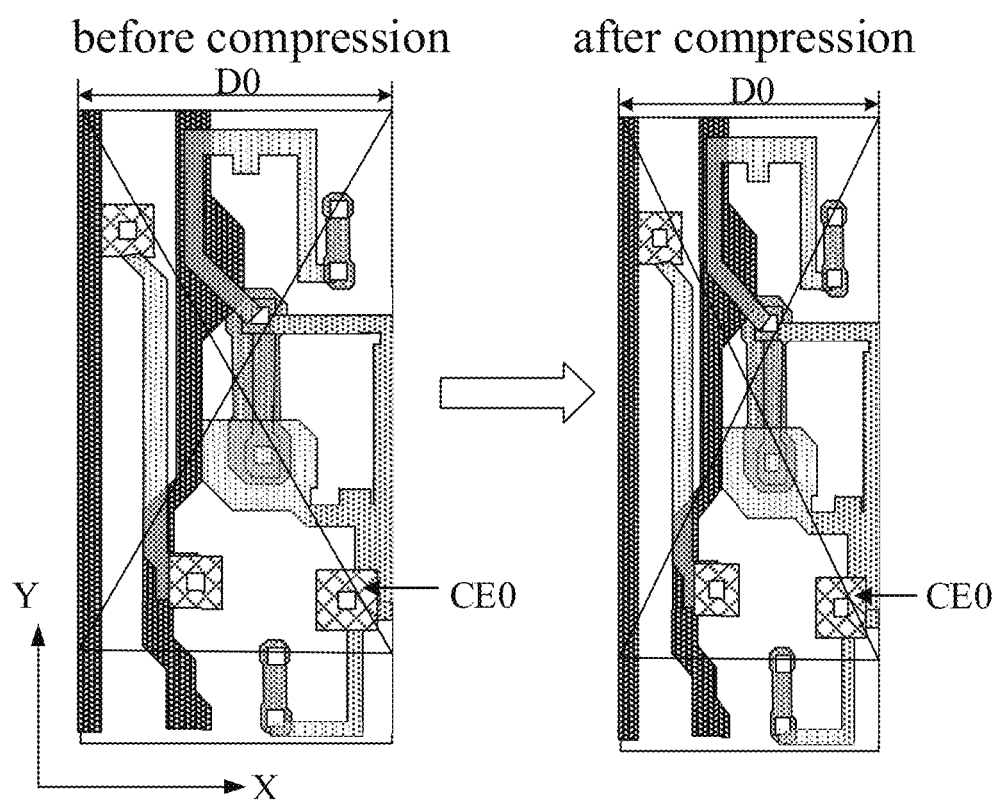
FIG. 14 illustrates a structural layout of a pixel circuit before and after compression.

For example, the width of each pixel circuit is different from the width of the first light-emitting element 30 by about 4 μm. Taking the case where the pixel circuit is compressed and the width difference is 4 μm as an example, FIG. 14 illustrates the structural layout of a pixel circuit before and after compression. As can be seen with reference to FIG. 14, the pixel circuit includes a driving structure and a connection element CE0 for connecting to the first electrode (anode) of the light-emitting element, the pitch of the connection element CE0 represents the pitch of the pixel circuit. The pitches of the pixel circuit and the light-emitting element before compression are both 1-100 µm in width and 2-100 µm in height. The pitches of the compressed light-emitting element can be unchanged compared with that before compression. For example, the pitch of the second light-emitting element 40 is equal to or smaller than the pitch of the first light-emitting element 20. The height of the compressed pixel circuit remains unchanged, but the width is narrowed by 1-20 µm. In this way, every few columns of compressed pixel circuits will add one or more columns of compressed pixel circuits, and the entire screen adopts this design to achieve full-screen compression. For example, these added columns can be selected to connect the second light-emitting elements 40 in the second display region R2 to control the second light-emitting elements 40 to emit light. In some embodiments, the added columns of pixel circuits close to the periphery of the second display region R2 are selected as the second pixel circuits 20 to be connected to the second light-emitting element 40. In this way, normal display can be achieved without changing the resolution of the display panel. That is, the existing space of the display panel is fully utilized to realize normal display. The effect achieved by compressing the pitch of the pixel circuit is that the number of light-emitting elements (including the first light-emitting element 30 and the second light-emitting element 40) remains unchanged, and further, compared with before compression, there is no obvious difference in the display effect, and the display panel has a better display effect.

In the embodiments of the present disclosure, the elements located in the same layer may be formed from the same film layer through the same patterning process. For example, the elements located in the same layer may be located on a surface of the same element away from the base substrate.

It should be noted that, in the drawings for describing the embodiments of the present disclosure, the thicknesses of a layer or a region is exaggerated for clarity. It will be understood that when an element such as a layer, a film, a region or a substrate is referred to as being "on" or "under" another element, it can be directly "on" or "under" the other element, or intermediate elements may be present.

In the embodiments of the present disclosure, the patterning or patterning process may only include a photolithography process, or may include a photolithography process and an etching step, or may include other processes for forming predetermined patterns such as printing and inkjet. The photolithography process refers to the process of film formation, exposure, development, etc., and using photoresist, mask, exposure machine, etc. to form patterns. Corresponding patterning processes may be selected according to the structures formed in the embodiments of the present disclosure.

In case of no conflict, features in the same embodiment or in different embodiments can be combined to obtain new embodiments.

What have been described above are only specific implementations of the present disclosure, but the protection scope of the present disclosure is not limited thereto. Any person skilled in the art who is familiar with the technical scope disclosed in the present disclosure can easily think of changes or substitutions, which should be included in the protection scope of the present disclosure. Therefore, the protection scope of the present disclosure should be based on the protection scope of the claims.

What is claimed is:

1. A display substrate, comprising:
a base substrate;
a first conductive element, located on the base substrate;
a first planarization layer, located on the first conductive element;
a second conductive element, located on the first planarization layer, and connected to the first conductive element through a first via hole penetrating the first planarization layer;
a second planarization layer, located on the second conductive element; and
a conductive line, located on the second planarization layer, wherein
the second conductive element is recessed at the first via hole, so that the second conductive element has a recessed portion and a peripheral portion located outside the recessed portion, the recessed portion has a bottom portion and a side portion, the bottom portion and the peripheral portion are connected by the side portion,
and the side portion of the recessed portion has an uneven surface to be configured to make light irradiated thereon be diffusely reflected,
the first conductive element is in direct contact with the second conductive element.

2. The display substrate according to claim 1, wherein the first planarization layer has an uneven surface at a position corresponding to the side portion, on which the second conductive element is conformably disposed.

3. The display substrate according to claim 1, wherein the side portion and the base substrate have an included angle, and the included angle is an acute angle.

4. The display substrate according to claim 1, wherein at least one of the bottom portion and the peripheral portion of the second conductive element has an uneven surface.

5. The display substrate according to claim 1, wherein both a surface of the side portion of the recessed portion close to the base substrate and a surface of the side portion of the recessed portion facing away from the base substrate are uneven surfaces.

6. The display substrate according to claim 1, wherein a surface of the second conductive element close to the base substrate is a smooth surface, and a surface of the side portion facing away from the base substrate is an uneven surface.

7. The display substrate according to claim 6, wherein a surface of at least one of the bottom portion and the peripheral portion facing away from the base substrate is an uneven surface.

8. A display device, comprising the display substrate of claim 1.

9. The display device according to claim 8, further comprising a photosensitive sensor, wherein the photosensitive sensor is located on one side of the display substrate.

10. A display substrate, comprising:
a base substrate;
a first conductive element, located on the base substrate;
a first planarization layer, located on the first conductive element;
a second conductive element, located on the first planarization layer, and connected to the first conductive element through a first via hole penetrating the first planarization layer;
a second planarization layer, located on the second conductive element; and
a conductive line, located on the second planarization layer, wherein
the second conductive element is recessed at the first via hole, so that the second conductive element has a recessed portion and a peripheral portion located outside the recessed portion, the recessed portion has a bottom portion and a side portion, the bottom portion and the peripheral portion are connected by the side portion, and the side portion of the recessed portion has an uneven surface to be configured to make light irradiated thereon be diffusely reflected, the display substrate further comprises a pixel unit, wherein the pixel unit comprises a pixel circuit and a light-emitting element, the pixel circuit is configured to drive the light-emitting element, the pixel unit comprises a first pixel unit and a second pixel unit, the display substrate comprises a first display region and a second display region, the pixel circuit and the light-emitting element of the first pixel unit are located in the first display region, the pixel circuit of the second pixel unit is located in the first display region, the light-emitting element of the second pixel unit is located in the second display region, and the pixel circuit of the second pixel unit is connected to the light-emitting element of the second pixel unit through the conductive line.

11. The display substrate according to claim 10, wherein the second display region is a light-transmitting display region, an orthographic projection of the pixel circuit of the first pixel unit on the base substrate at least partially overlaps with an orthographic projection of the light-emitting element of the first pixel unit on the base substrate, and an orthographic projection of the pixel circuit of the second pixel unit on the base substrate does not overlap with an orthographic projection of the light-emitting element of the second pixel unit on the base substrate.

12. The display substrate according to claim 10, wherein an orthographic projection of the conductive line on the base substrate partially overlaps with the orthographic portion of the pixel circuit of the first pixel unit on the substrate.

13. The display substrate according to claim 10, further comprising a connection element, wherein the pixel circuit of the pixel unit is connected to the conductive line through the connection element or is connected to the light-emitting element of the first pixel unit.

14. The display substrate according to claim 13, wherein the connection element comprises a first connection electrode and a second connection electrode, and the first connection electrode is connected to the second connection electrode.

15. The display substrate according to claim 14, wherein the first conductive element comprises the first connection electrode, and the second conductive element comprises the second connection electrode connected to the first connection electrode.

16. The display substrate according to claim 10, wherein the pixel circuit comprises a driving transistor, and the driving transistor comprises a gate electrode; and the display substrate further comprises:
a first gate signal line, connected to the gate electrode of the driving transistor;
a constant voltage line, configured to provide a first constant voltage to the pixel circuit; and
a shield electrode, connected to the constant voltage line, and an orthographic projection of the first gate signal line on the base substrate falls within an orthographic projection of the shield electrode on the base substrate.

17. The display substrate according to claim 16, wherein the first conductive element comprises the constant voltage line, and the second conductive element comprises the shield electrode connected to the constant voltage line.

18. The display substrate according to claim 16, wherein the first conductive element and the constant voltage line are located in the same layer, and the second conductive element and the shield electrode are located in the same layer.

19. A display substrate, comprising:
a base substrate, comprising a first display region and a second display region;
a pixel unit, located on the base substrate, wherein the pixel unit comprises a pixel circuit and a light-emitting element, the pixel circuit is configured to drive the light-emitting element, the pixel unit comprises a first pixel unit and a second pixel unit, the pixel circuit and the light-emitting element of the first pixel unit are located in the first display region, the pixel circuit of the second pixel unit is located in the first display region, the light-emitting element of the second pixel unit is located in the second display region, and the pixel circuit of the second pixel unit is connected to the light-emitting element of the second pixel unit through a conductive line;
a connection element, connected to the pixel circuit, wherein the pixel circuit of the first pixel unit is connected to the light-emitting element of the first pixel unit through the connection element, or, the pixel circuit of the second pixel unit is connected to the conductive line through the connection element, and the connection element comprises a first connection electrode and a second connection electrode;
a first planarization layer, located on the first connection electrode, wherein the second connection electrode is located on the first planarization layer, and is connected to the first connection electrode through a via hole penetrating the first planarization layer; and
a second planarization layer, located on the second connection electrode, wherein the conductive line is located on the second planarization layer,
the second connection electrode is recessed at the via hole, so that the second conductive electrode has a recessed portion and a peripheral portion located outside the recessed portion, the recessed portion has a bottom portion and a side portion, the bottom portion and the peripheral portion are connected by the side portion,
and the side portion of the second connection electrode has an uneven surface to be configured to make light irradiated thereon be diffusely reflected.

20. The display substrate according to claim 19, wherein the pixel circuit comprises a driving transistor, and the driving transistor comprises a gate electrode;
the display substrate further comprises:
a first gate signal line, connected to the gate electrode of the driving transistor;
a constant voltage line, configured to provide a first constant voltage to the pixel circuit; and
a shield electrode, connected to the constant voltage line, and an orthographic projection of the first gate signal line on the base substrate falls within an orthographic projection of the shield electrode on the base substrate,
wherein the first planarization layer is located on the constant voltage line, the shield electrode is located on the first planarization layer, the second planarization layer is located on the shield electrode, and the shield electrode is connected to the constant voltage line through a via hole penetrating the first planarization layer;

the shield electrode is recessed at the via hole where the shield electrode is connected to the constant voltage line, so that the shield electrode has a recessed portion and a peripheral portion located outside the recessed portion, the recessed portion of the shield electrode has a bottom portion and a side portion, the bottom portion of the shield electrode is connected to the peripheral portion of the shield electrode through the side portion of the shield electrode, and the side portion of the shield electrode has an uneven surface to be configured to make light irradiated thereon be diffusely reflected.

\* \* \* \* \*